United States Patent
Sammoura et al.

(10) Patent No.: US 10,864,553 B2
(45) Date of Patent: Dec. 15, 2020

(54) PIEZOELECTRIC TRANSDUCERS AND METHODS OF MAKING AND USING THE SAME

(71) Applicant: The Regents of the University of California, Oakland, CA (US)

(72) Inventors: Firas Sammoura, San Jose, CA (US); Sina Akhbari, Berkeley, CA (US); Liwei Lin, San Ramon, CA (US)

(73) Assignee: The Regents of the University of California, Oakland, CA (US)

( * ) Notice: Subject to any disclaimer, the term of this patent is extended or adjusted under 35 U.S.C. 154(b) by 513 days.

(21) Appl. No.: 15/540,008

(22) PCT Filed: Jan. 14, 2016

(86) PCT No.: PCT/US2016/013432
§ 371 (c)(1),
(2) Date: Jun. 26, 2017

(87) PCT Pub. No.: WO2016/115363
PCT Pub. Date: Jul. 21, 2016

(65) Prior Publication Data
US 2017/0368574 A1     Dec. 28, 2017

Related U.S. Application Data

(60) Provisional application No. 62/104,556, filed on Jan. 16, 2015.

(51) Int. Cl.
*H01L 41/09* (2006.01)
*B06B 1/06* (2006.01)
(Continued)

(52) U.S. Cl.
CPC .......... *B06B 1/0603* (2013.01); *B06B 1/0622* (2013.01); *H01L 41/047* (2013.01);
(Continued)

(58) Field of Classification Search
CPC ... B06B 1/0603; B06B 1/0622; H01L 41/047; H01L 41/0471; H01L 41/0973;
(Continued)

(56) References Cited

U.S. PATENT DOCUMENTS

| | | | | |
|---|---|---|---|---|
| 9,337,411 | B2* | 5/2016 | Bird | H01L 41/107 |
| 2007/0236107 | A1* | 10/2007 | Maruyama | H01L 41/083 |
| | | | | 310/366 |

(Continued)

*Primary Examiner* — Thomas M Dougherty
(74) *Attorney, Agent, or Firm* — Rudy J. Ng; Bozicevic, Field & Francis LLP

(57) ABSTRACT

Piezoelectric transducers are provided. The piezoelectric transducer includes a first piezoelectric layer, a second piezoelectric layer disposed on at least a portion of the first piezoelectric layer, and a middle electrode layer disposed between the first and second piezoelectric layers, where the middle electrode layer includes an inner region and an outer region spaced apart from the inner region. Methods of making the piezoelectric transducers are also provided. The piezoelectric transducers and methods find use in a variety of applications, including devices, such as electronics devices having one or more (e.g., an array) of the piezoelectric transducers.

18 Claims, 21 Drawing Sheets

(51) Int. Cl.
    *H01L 41/113*     (2006.01)
    *H01L 41/047*     (2006.01)
    *H01L 41/27*     (2013.01)
    *H01L 41/331*     (2013.01)
    *H01L 41/332*     (2013.01)
    *H01L 41/316*     (2013.01)

(52) U.S. Cl.
    CPC ...... *H01L 41/0471* (2013.01); *H01L 41/0973* (2013.01); *H01L 41/1138* (2013.01); *H01L 41/27* (2013.01); *H01L 41/331* (2013.01); *H01L 41/332* (2013.01); *H01L 41/316* (2013.01)

(58) Field of Classification Search
    CPC ... H01L 41/1138; H01L 41/27; H01L 41/331; H01L 41/332; H01L 41/316
    USPC ................. 310/328, 332–334, 358, 365, 366
    See application file for complete search history.

(56) References Cited

U.S. PATENT DOCUMENTS

| | | | |
|---|---|---|---|
| 2008/0122317 A1* | 5/2008 | Fazzio | G01H 11/08 310/328 |
| 2009/0149801 A1 | 6/2009 | Crandall et al. | |
| 2011/0215677 A1 | 9/2011 | Jiang et al. | |
| 2012/0293046 A1 | 11/2012 | Nikolovski | |
| 2013/0162102 A1 | 6/2013 | Sammoura et al. | |
| 2013/0278111 A1* | 10/2013 | Sammoura | H01L 41/0926 310/317 |

\* cited by examiner

PIEZOELECTRIC TRANSDUCERS AND METHODS OF MAKING AND USING THE SAME

CROSS-REFERENCE TO RELATED APPLICATIONS

This application claims priority pursuant to 35 U.S.C. § 119(e) to the filing date of U.S. Provisional Application No. 62/104,556, filed Jan. 16, 2015, the disclosure of which is incorporated herein by reference.

INTRODUCTION

Conventional ultrasound transducers are typically based on an electroceramic material, such as lead zirconium titanate (PZT), as the piezoelectric material. These types of piezoelectric transducers operate in the thickness mode for various types of applications, including medical ultrasonography. In these cases, the operation resonant frequency is determined by the thickness of the PZT layer and manufacturing process control is used to meet the targeted frequency. However, conventional piezoelectric transducers typically have large transducer dimensions, which make them impractical for applications in portable, hand-held devices, such as cell phones. In addition, piezo-ceramics inherently have high acoustic impedance, which may be difficult to match with liquid or air media.

Micromachined ultrasonic transducers (MUTs) typically have better acoustic matching and larger bandwidth compared to conventional ultrasound transducers. Micromachined ultrasonic transducers may be actuated either capacitively (cMUTs) or piezoelectrically (pMUTs). However, cMUTs require high DC voltage and may have non-linear plate deflection with an applied bias. PMUTs may have low electromechanical coupling. Ultrasound transducers with small form factor, linear response, low voltage, and high acoustic pressure are desirable for next generation hand-held devices.

SUMMARY

Aspects of the present disclosure include a piezoelectric transducer that includes a first piezoelectric layer, a second piezoelectric layer disposed on at least a portion of the first piezoelectric layer, and a middle electrode layer disposed between the first and second piezoelectric layers, where the middle electrode layer includes an inner region and an outer region spaced apart from the inner region.

In some embodiments, the inner region and the outer region of the middle electrode layer are substantially coplanar.

In some embodiments, the inner region of the middle electrode layer is circular.

In some embodiments, the outer region of the middle electrode layer is annular.

In some embodiments, the piezoelectric transducer includes a bottom electrode layer disposed on a surface of the first piezoelectric layer opposite the middle electrode layer.

In some embodiments, the piezoelectric transducer includes a top electrode layer disposed on a surface of the second piezoelectric layer opposite the middle electrode layer.

In some embodiments, the piezoelectric transducer includes a support layer (e.g., bottom support layer) disposed on a surface of the bottom electrode layer opposite the first piezoelectric layer.

In some embodiments, the first piezoelectric layer and the second piezoelectric layer have the same polarity.

In some embodiments, the piezoelectric transducer includes a substrate on which at least a portion of the piezoelectric transducer is disposed.

In some embodiments, the substrate includes an opening through the substrate and a portion of the piezoelectric transducer is exposed through the opening.

In some embodiments, the piezoelectric transducer has a diameter ranging from 10 µm to 5000 µm.

In some embodiments, the piezoelectric transducer has a resonant displacement of 400 nm/V or more.

In some embodiments, the piezoelectric transducer includes a via exposing a portion of the inner region of the middle electrode layer.

In some embodiments, the piezoelectric transducer includes a via exposing a portion of the outer region of the middle electrode layer.

In some embodiments, the piezoelectric transducer includes a via exposing a portion of the bottom electrode.

In some embodiments, the piezoelectric transducer is substantially planar.

In some embodiments, the piezoelectric transducer is curved.

Aspects of the present disclosure include a piezoelectric transducer having a resonant displacement of 400 nm/V or more.

Aspects of the present disclosure include a device having one or more piezoelectric transducers, where each piezoelectric transducer includes a first piezoelectric layer, a second piezoelectric layer disposed on at least a portion of the first piezoelectric layer, and a middle electrode layer disposed between the first and second piezoelectric layers, where the middle electrode layer includes an inner region and an outer region spaced apart from the inner region.

In some embodiments, the device includes an array of the piezoelectric transducers.

In some embodiments, the array includes 10 or more of the piezoelectric transducers.

Aspects of the present disclosure include a method of making a piezoelectric transducer. The method includes depositing one or more layers of semiconductor materials on a first surface of a substrate, producing a piezoelectric transducer on the one or more layers of the semiconductor materials, and removing substrate material from an opposing second surface of the substrate to produce an opening through the substrate to expose a portion of the layer of the semiconductor material.

In some embodiments, the piezoelectric transducer includes a bottom electrode layer, a first piezoelectric layer disposed on a surface of the bottom electrode layer, a second piezoelectric layer disposed on at least a portion of the first piezoelectric layer, a middle electrode layer disposed between the first and second piezoelectric layers, and a top electrode layer disposed on a surface of the second piezoelectric layer.

In some embodiments, the method includes producing one or more openings in the first piezoelectric layer, the second piezoelectric layer, and/or the top electrode layer for forming one or more electrical contacts to the bottom electrode layer and/or the middle electrode layer.

Aspects of the present disclosure include a method of directing sound waves to a target. The method includes producing sound waves from a piezoelectric transducer, where the piezoelectric transducer is configured to direct the produced sound waves to the target. The piezoelectric transducer includes a first piezoelectric layer, a second piezoelectric layer disposed on at least a portion of the first piezoelectric layer, and a middle electrode layer disposed between the first and second piezoelectric layers, where the middle electrode layer includes an inner region and an outer region spaced apart from the inner region, In some embodiments, the piezoelectric transducer further includes a bottom electrode layer disposed on a surface of the first piezoelectric layer opposite the middle electrode layer, and a top electrode layer disposed on a surface of the second piezoelectric layer opposite the middle electrode layer.

In some embodiments, the producing includes applying voltages having opposite phase to the inner region and the outer region of the middle electrode layer.

In some embodiments, the produced sound waves are ultrasound waves.

BRIEF DESCRIPTION OF THE DRAWINGS

(FIG. 3, panel a) depositions of AlN stop layer, bottom Mo electrode, bottom AlN layer, and middle Mo electrode; (FIG. 3, panel b) patterning and etching of the middle electrode; (FIG. 3, panel c) depositions of top AlN layer and top Mo electrode; opening of contacts to middle and bottom electrodes; and (FIG. 3, panel d) backside deep reactive-ion etching (DRIE) to release the diaphragm, according to embodiments of the present disclosure.

FIG. 4, panel c, shows a SEM image of a cleaved device showing the cross-sectional view, and FIG. 4, panel d, shows a close-up view of the diaphragm in FIG. 4, panel c, showing good crystal alignment of both AlN layers, according to embodiments of the present disclosure.

(FIG. 9, panel b) a conventional dual-electrode unimorph pMUT with one active layer and inner and outer electrodes driven differentially; (FIG. 9, panel c) a dual electrode bimorph (DEB) pMUT according to embodiments of the present disclosure, which can be driven differentially and can have 4× the displacement sensitivity compared to (FIG. 9, panel a); (FIG. 9, panel d) the normal radial stress profile of a clamped diaphragm at its first mode of operation.

(FIG. 10, panel a) sputtering of AlN/Mo/AlN stack; (FIG. 10, panel b) PECVD $SiO_2$ deposition; (FIG. 10, panel c) middle Mo electrode sputtering; (FIG. 10, panel d) patterning of the middle Mo electrode and $SiO_2$; (FIG. 10, panel e) second AlN active layer sputtering; (FIG. 10, panel f) second PECVD $SiO_2$ deposition; (FIG. 10, panel g) top Mo electrode sputtering; (FIG. 10, panel h) top Mo patterning; (FIG. 10, panel i) via dry etching half-way down to the bottom electrode; (FIG. 10, panel j) via dry and wet etching to expose the middle and bottom electrodes; and (FIG. 10, panel k) backside DRIE.

FIG. 11 shows images of: (FIG. 11, panel a) A 10-element array with 60×60 DEB pMUTs attached to a printed circuit board (PCB); (FIG. 11, panel b) A top view optical image of the top edge of a 6×60 DEB pMUT element of the 60×60 array shown in (FIG. 11, panel a), according to embodiments of the present disclosure.

FIG. 12, panel b, shows a close-up view of a DEB pMUT near the gap region between the inner circular and outer annular middle electrodes. FIG. 12, panel c, shows a cross-sectional view SEM image of a suspended diaphragm of a DEB pMUT, showing the residual silicon around the edge of the diaphragm due to under-etching of backside silicon. FIG. 12, panel d, shows a close-up SEM image of a via to the bottom electrode before the completion of the AlN etching process showing residual AlN grains on top of the bottom electrode.

FIG. 14, panels b and c, show graphs of measured and simulated center displacement per input voltage frequency response of two pMUTs with radii of 230 μm and 170 μm, respectively.

FIG. 15, panel c, shows a graph of displacement magnitude frequency responses of various points located along the radius of pMUT (1,1) of the array described in (FIG. 15, panel a), where $p_1$ was at the center and $p_9$ was at the clamped edge of the diaphragm and the rest of the points lay in between sequentially. FIG. 15, panel d, shows a graph of low frequency displacement of points $p_1$ to $p_9$ described in (FIG. 15, panel c) demonstrating the first mode shape of pMUT (1,1).

FIG. 17, panel b, shows a graph indicating the linearity of the pMUT array of (FIG. 17, panel a) in air. FIG. 17, panel c, shows an image of a measurement setup in a water tank. FIG. 17, panel d, shows an image of a measurement setup in air.

FIG. 18, panel c, shows a graph of the axial intensity driven differentially under 5 Vac, showing desirable acoustic intensity up to 2.5 mm penetration depth. FIG. 18, panel d, shows a graph of bandwidth testing of a 6×60 single channel array, showing very high bandwidth of 1.2 MHz with a center frequency of 720 kHz.

DETAILED DESCRIPTION

Piezoelectric Transducers

Figure 1:
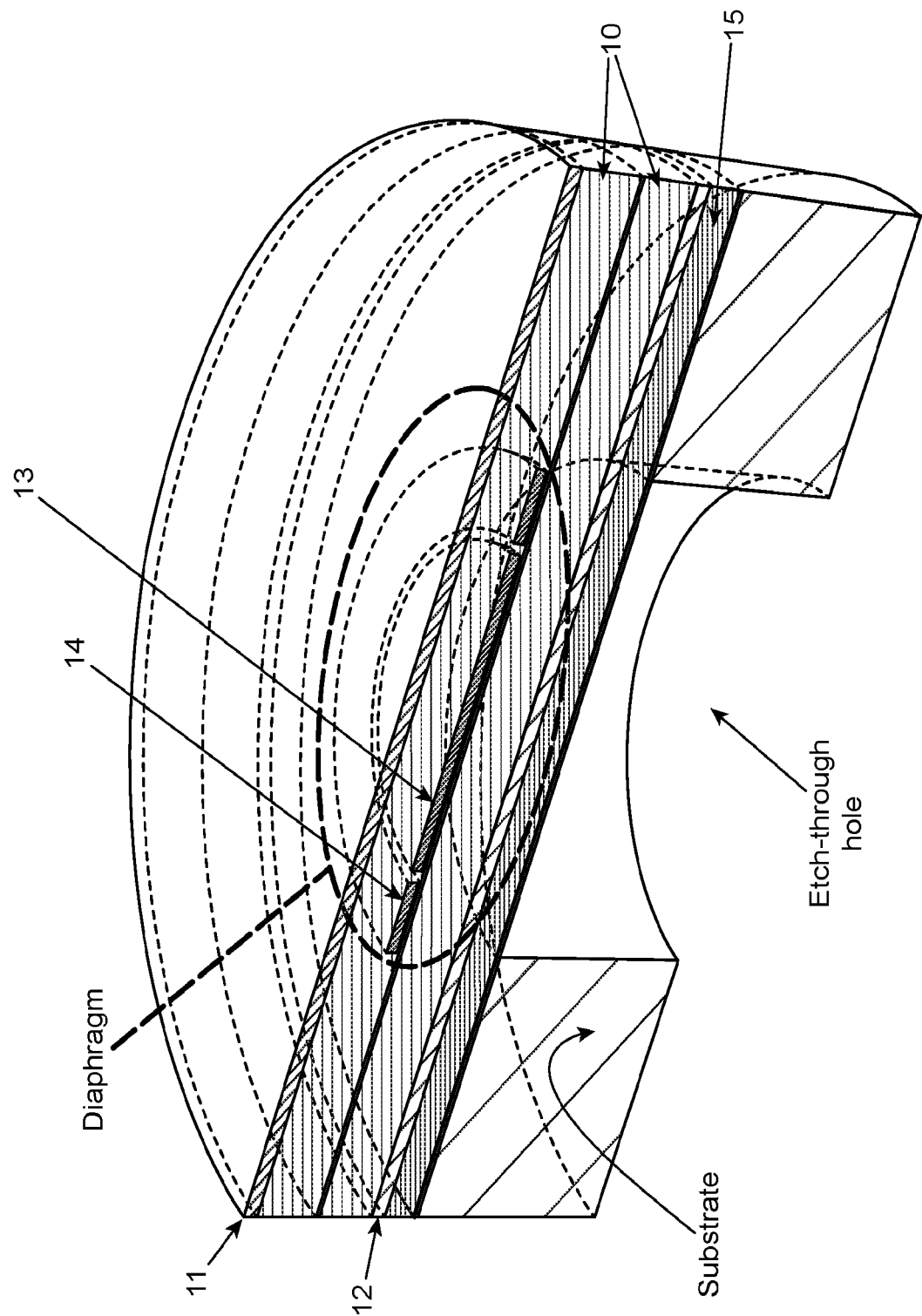
FIG. 1 shows a 3D schematic showing a cross-sectional view of a bimorph piezoelectric micromachined ultrasonic transducer (pMUT) with two active aluminum nitride (AlN) layers and dual electrode configuration: inner circular shape and outer annular shape electrodes, according to embodiments of the present disclosure.

Piezoelectric transducers are provided. The piezoelectric transducer includes a first piezoelectric layer, a second piezoelectric layer disposed on at least a portion of the first piezoelectric layer, and a middle electrode layer disposed between the first and second piezoelectric layers, where the middle electrode layer includes an inner region and an outer region spaced apart from the inner region. Methods of making the piezoelectric transducers are also provided. The piezoelectric transducers and methods find use in a variety of applications, including devices, such as electronics devices having one or more (e.g., an array) of the piezoelectric transducers.

Aspects of the present disclosure include a piezoelectric transducer. As used herein, a piezoelectric transducer may also be referred to as a piezoelectric micromachined ultrasonic transducer (pMUT), a "membrane", or a "diaphragm". In certain embodiments, the piezoelectric transducer is provided on a substrate. The substrate may be any convenient substrate that is compatible with the piezoelectric transducer and materials therein, as well as the fabrication process for the piezoelectric transducer. For example, the substrate may be composed of a material that is compatible with integrated circuits and fabrication processes for integrated circuits. In some instances, the substrate is compatible with complementary metal-oxide semiconductor (CMOS) fabrication processes. For example, the substrate may be composed of a material compatible with deposition processes, such as chemical and/or physical layer deposition processes, etching, lithography, combinations thereof, and the like. In certain embodiments, the substrate is a semiconductor material, such as, but not limited to, silicon, silicon nitride, combinations thereof, and the like.

In certain embodiments, the piezoelectric transducer is disposed on the substrate. For instance, the piezoelectric transducer may be provided on a surface of the substrate, such as on a top surface of the substrate. At least a portion of the piezoelectric transducer may be in contact with the surface of the substrate. For example, as described in more detail below, a peripheral portion of the piezoelectric transducer may be in contact with the substrate, while a central portion of the piezoelectric transducer does not contact the substrate. The central portion of the piezoelectric transducer that is not in contact with the substrate may be exposed through an opening (e.g., a hole) in the substrate. The opening in the substrate (also referred to herein as a "via" or a "hole") may extend through the entire thickness of the substrate such that a portion of the surface of the piezoelectric transducer, e.g., a bottom surface of the piezoelectric transducer, is exposed. By "exposed" is meant that the surface is in contact with the surrounding environment and does not substantially contact the underlying substrate. In certain instances, the opening through the substrate may be cylindrical in shape and may have an average diameter ranging from 1 µm to 10 mm (10,000 µm), or 1 µm to 7.5 mm (7500 µm), or 1 µm to 5 mm (5000 µm), or 10 µm to 5 mm (5000 µm), such as from 10 µm to 2 mm (2000 µm), or 20 µm to 1 mm (1000 µm), or 30 µm to 500 µm, or 40 µm to 200 µm, or 50 µm to 200 µm, or 100 µm to 200 µm, or 120 µm to 180 µm. In some embodiments, the central portion of the piezoelectric transducer that is not in contact with the substrate may be suspended over the substrate. In these embodiments, the central portion that is not in contact with the underlying substrate may be suspended over the substrate by the peripheral portion of the piezoelectric transducer, which is disposed on the substrate. One or more support layers may be provided between the peripheral portion of the piezoelectric transducer and the substrate to elevate the central portion of the piezoelectric transducer above the surface of the substrate.

In certain embodiments, the piezoelectric transducer can have a radius of curvature of from 10 µm to 10,000 µm, such as from 20 µm to 8000 µm, including 50 µm to 5000 µm, or 100 µm to 2000 µm, or 500 µm to 1500 µm, or 600 µm to 1000 µm. In some instances, the piezoelectric transducer is circular in shape. In some instances, the average diameter of such piezoelectric transducers can be from 1 µm to 10 mm (10,000 µm), or 1 µm to 7.5 mm (7500 µm), or 1 µm to 5 mm (5000 µm), or 10 µm to 5 mm (5000 µm), such as from 10 µm to 2 mm (2000 µm), or 20 µm to 1 mm (1000 µm), or 30 µm to 500 µm, or 40 µm to 200 µm, or 50 µm to 200 µm, or 100 µm to 200 µm, or 120 µm to 180 µm. In some instances, the average diameter of a piezoelectric transducer can be from 10 µm to 5 mm, or 10 µm to 4 mm, or 10 µm to 3 mm, or 10 µm to 2 mm, or 10 µm to 1 mm, such as from 25 µm to 2 mm, or 50 µm to 1 mm, or 50 µm to 500 µm, or 50 µm to 250 µm, or 100 µm to 250 µm, such as about 250 µm (e.g., 230 µm). In some instances, the average diameter of a piezoelectric transducer can be from 10 µm to 5 mm, or 10 µm to 4 mm, or 10 µm to 3 mm, or 10 µm to 2 mm, or 10 µm to 1 mm, such as from 25 µm to 2 mm, or 50 µm to 1 mm, or 100 µm to 750 µm, or 250 µm to 750 µm, or 300 µm to 700 µm, or 400 µm to 500 µm, such as about 450 µm (e.g., 460 µm).

In certain embodiments, the support layer is circular in shape and has a diameter that is substantially the same as that of the piezoelectric transducer described above. In some instances, the support layer has an average thickness ranging from 100 nm to 10 µm, such as from 250 nm to 10 µm, or 500 nm to 10 µm, or 750 nm to 10 µm, or 1 µm to 10 µm, or 1 µm to 9 µm, or 1 µm to 8 µm, or 1 µm to 7 µm, or 1 µm to 6 µm, or from 2 µm to 6 µm, or 3 µm to 6 µm, or 4 µm to 6 µm. In some cases, the support layer has an average thickness of 5 µm. In some instances, the support layer has an average thickness ranging from 10 nm to 1 µm, such as from 25 nm to 1 µm, or 50 nm to 1 µm, or 75 nm to 1 µm, or 100 nm to 1 µm, or 100 nm to 900 nm, or 100 nm to 800 nm, or 100 nm to 700 nm, or 100 nm to 600 nm, or 100 nm to 500 nm, or 100 nm to 400 nm, or 100 nm to 300 nm, or 150 nm to 250 nm, such as, for example, about 200 nm (e.g., 210 nm).

As used in the present disclosure, the term "average" refers to the arithmetic mean. Average thickness refers to a layer, where the layer may have a thickness that varies from one region of the layer to another region of the layer; the average thickness is the average of the various thicknesses of the regions of the layer.

In some embodiments, the middle electrode layer includes an inner region (also referred to herein as a central portion) and an outer region (also referred to herein as a peripheral portion). The outer region (e.g., the peripheral portion) of the middle electrode layer may surround the periphery of the inner region (e.g., the central portion) of the middle electrode layer. For example, the peripheral portion may be adjacent to but not in contact with the external edges (e.g., the circumferential edge) of the central portion of the middle electrode layer. Stated another way, the inner region of the middle electrode layer may be spaced apart from the outer region of the middle electrode layer.

As described above, in certain embodiments, the central portion of the middle electrode layer is surrounded by the peripheral portion. In embodiments where the central portion is circular in shape, the surrounding peripheral portion may have an annular (i.e., ring) shape. In some cases, the circular central portion and annular peripheral portion are concentric. In some instances, the central portion is partially surrounded by the peripheral portion. For example, the peripheral portion may surround a segment of the central portion that is less than the entire periphery of the central portion, such as 99% or less, or 97% or less, or 95% or less, or 90% or less, or 85% or less, or 80% or less, or 75% or less, or 70% or less, or 65% or less, or 60% or less, or 55% or less, or 50% or less.

Where the central portion of the middle electrode layer is circular (or substantially circular) in shape, the circular central portion may be in the shape of a cylinder having a diameter and thickness as described herein. The circular central portion may have an outer edge (e.g., an external edge or circumferential edge). As described above, the peripheral portion surrounding the central portion of the middle electrode may have an annular (i.e., ring) shape. In these cases, the peripheral portion of the middle electrode layer has an inner diameter and an outer diameter. In some cases, the distance between the external edge (e.g., circumferential edge) of the central portion of the middle electrode layer and the inner edge of the annular peripheral portion of the middle electrode layer is 10 µm or less, such as 5 µm or less, or 1 µm or less, or 750 nm or less, or 500 nm or less, or 250 nm or less, or 100 nm or less, or 75 nm or less, or 50 nm or less, or 25 nm or less, or 10 nm or less, or 5 nm or less. In some cases, the gap between the external edge (e.g., the circumferential edge) of the central portion of the middle electrode layer and the inner edge of the annular peripheral portion of the middle electrode layer contains a material, such as a piezoelectric material. The piezoelectric material in the gap between the inner region and the outer region of the middle electrode layer may be the same material used to form the piezoelectric layers of the piezoelectric transducer, including, but not limited to, aluminum nitride (AlN). In some instances, the piezoelectric material in the gap between the inner region and the outer region of the middle electrode layer is the same material used to form the second (top) piezoelectric layer, including, but not limited to, AlN. The piezoelectric material in the gap between the inner region and the outer region of the middle electrode layer may be deposited during the same deposition step used to form the second (top) piezoelectric layer.

In certain cases, the central portion of the middle electrode layer is circular in shape. In certain instances, the central portion of the middle electrode layer has a diameter that is smaller than the diameter of the piezoelectric transducer, such as a 1.0 diameter that is 95% or less of the diameter of the piezoelectric transducer, or 90% or less, or 85% or less, or 80% or less, or 75% or less or 70% or less, or 65% or less, or 60% or less of diameter of the piezoelectric transducer. In some cases, the central portion of the middle electrode layer has a diameter that is 70% of the diameter of the piezoelectric transducer. For example, in some embodiments, a circular central portion of the middle electrode has a diameter ranging from 1 µm to 5 mm, or 1 µm to 4 mm, or 1 µm to 3 mm, or 1 µm to 2 mm, or 1 µm to 1 mm, such as from 1 µm to 750 µm, or 1 µm to 500 µm, or 1 µm to 250 µm, or 5 µm to 200 µm, or 10 µm to 200 µm, or 10 µm to 150 µm. In some embodiments, a circular central portion of the middle electrode has a diameter ranging from 1 µm to 5 mm, or 1 µm to 4 mm, or 1 µm to 3 mm, or 1 µm to 2 mm, or 1 µm to 1 mm, such as from 1 µm to 750 µm, or 1 µm to 500 µm, or 1 µm to 250 µm, or 5 µm to 250 µm, or 10 µm to 250 µm, or 50 µm to 250 µm, or 75 µm to 250 µm, or 100 µm to 250 µm, or 100 µm to 200 µm, such as 160 µm or 150 µm. In some embodiments, a circular central portion of the middle electrode has a diameter ranging from 1 µm to 5 mm, or 1 µm to 4 mm, or 1 µm to 3 mm, or 1 µm to 2 mm, or 1 µm to 1 mm, such as from 10 µm to 750 µm, or 50 µm to 500 µm, or 100 µm to 500 µm, or 150 µm to 500 µm, or 200 µm to 500 µm, or 250 µm to 450 µm, or 300 µm to 400 µm, or 300 µm to 350 µm, such as 320 µm or 325 µm.

In certain embodiments of the piezoelectric transducer, the inner region of the middle electrode layer has substantially the same surface area as the outer region of the middle electrode layer. For instance, the circular central portion of the middle electrode layer may have substantially the same surface area as the annular peripheral portion of the middle electrode layer that surrounds the circular central portion of the middle electrode layer. In some instances, the surface area of the circular central portion of the middle electrode layer and the annular peripheral portion of the middle electrode layer are substantially the same and are each 1 µm² to 5 mm², such as 1 µm² to 4 mm², or 1 µm² to 3 mm², or 1 µm² to 2 mm², or 1 µm² to 1 mm², or 1 µm² to 0.75 mm², or 1 µm² to 0.5 mm², or 1 µm² to 0.25 mm², or 1 µm² to 0.1 mm², or 1 µm² to 100,000 µm², or 1 µm² to 75,000 µm², or 1 µm² to 50,000 µm², or 1 µm² to 25,000 µm², or 1 µm² to 10,000 µm², or 1 µm² to 7,500 µm², or 1 µm² to 5,000 µm², or 1 µm² to 2,500 µm², or 1 µm² to 1,000 µm², or 1 µm² to 750 µm², or 1 µm² to 500 µm², or 1 µm² to 250 µm², or 1 µm² to 100 µm². For example, the surface area of the circular central portion of the middle electrode layer and the annular peripheral portion of the middle electrode layer may be substantially the same and may each be 100,000 µm² or less, or 75,000 µm² or less, or 50,000 µm² or less, or 25,000 µm² or less, or 10,000 µm² or less, or 5,000 µm² or less.

The inner region and the outer region of the middle electrode layer may be substantially coplanar. In these embodiments, the inner region and the outer region of the middle electrode layer may be disposed on the first piezoelectric layer such that the inner region and the outer region of the middle electrode layer are substantially coplanar.

In certain embodiments, the support layer of the piezoelectric transducer may include a portion in contact with the substrate. In these embodiments, a portion of the support layer may not be in contact with the substrate. In certain embodiments, at least a portion of the support layer may not be in contact with the substrate. For example, a central portion of the support layer may not be in contact with the substrate, while a peripheral portion of the support layer may be in contact with the substrate. In these embodiments, the central portion of the support layer that is not in contact with the substrate may facilitate movement of the central portion of the support layer when the piezoelectric transducer is in use. In certain embodiments, at least part of the peripheral portion of the support layer is in contact with the substrate. For example, a part of the peripheral portion of the support layer may support the support layer on the substrate. In some instances, the peripheral portion of the support layer may contact the substrate and suspend the central portion of the support layer over the substrate, where the central portion of the support layer is not in contact with the substrate as described above. In these embodiments, the piezoelectric transducer may be supported on the substrate by the peripheral portion of the support layer while allowing the central portion of the support layer to move (e.g., to be displaced) when the piezoelectric transducer is in use.

As described above, the piezoelectric transducer may include an opening in the substrate that extends through the entire thickness of the substrate such that a portion of a surface of the piezoelectric transducer, e.g., a bottom surface of the piezoelectric transducer, is exposed and does not substantially contact the underlying substrate. In embodiments of the piezoelectric transducer that include a support layer, the support layer may be the layer of the piezoelectric transducer that is exposed through the opening in the substrate.

The support layer may be composed of any convenient material that is compatible with the piezoelectric transducer and other materials therein, as well as the fabrication process for the piezoelectric transducer. For example, the support layer may be a material that is compatible with integrated circuits and fabrication processes for integrated circuits. In some instances, the support layer is compatible with complementary metal-oxide semiconductor (CMOS) fabrication processes. For example, the support layer may be composed of a material compatible with deposition processes, such as chemical and/or physical layer deposition processes, etching, lithography, combinations thereof, and the like. In certain embodiments, the support layer is a semiconductor material, such as, but not limited to, silicon, silicon nitride, combinations thereof, and the like. In some cases, the support layer is composed of an oxide, such as, but not limited to, a low temperature oxide, e.g., silicon dioxide, silicon, silicon nitride, aluminum nitride (AlN), combinations thereof, and the like. In some cases, the piezoelectric transducer includes a support layer, such as an AlN support layer.

In certain embodiments, the piezoelectric transducer includes a piezoelectric element disposed on the support layer. The piezoelectric element may be disposed on a surface of the support layer, such as on a surface of the support layer opposite the exposed surface of the support layer. In some instances, the piezoelectric element includes several layers, which together compose the piezoelectric element. In some cases, the piezoelectric element includes one or more electrode layers, and one or more piezoelectric layers. The one or more electrode layers may be disposed on opposing surfaces of a piezoelectric layer or between two piezoelectric layers. For example, the piezoelectric element may include a bottom electrode layer, a first piezoelectric layer, a middle electrode layer, a second piezoelectric layer, and a top electrode layer. The bottom electrode layer may be disposed on the support layer. The first piezoelectric layer may be disposed on the bottom electrode layer. The middle electrode layer may be disposed on the first piezoelectric layer. As such, the bottom electrode layer may be disposed on a surface of the first piezoelectric layer opposite the middle electrode layer. Stated another way, the first piezoelectric layer may be sandwiched between the bottom electrode layer and the middle electrode layer. The second piezoelectric layer may be disposed on the middle electrode layer, and the top electrode layer may be disposed on the second piezoelectric layer. As such, the top electrode layer may be disposed on a surface of the second piezoelectric layer opposite the middle electrode layer. Stated another way, the second piezoelectric layer may be sandwiched between the middle electrode layer and the top electrode layer. Other layers may also be included as desired, such as, but not limited to, a passivation layer, a barrier layer, and the like.

The piezoelectric transducer may be substantially planar. For instance, each layer of the piezoelectric element may be substantially planar, such that the entire multi-layer piezoelectric element is also substantially planar. In other embodiments, the piezoelectric transducer, or a portion thereof, may be curved. For instance, the exposed portion of the piezoelectric transducer (e.g., the portion exposed by the backside etching process as described herein) may be curved. Embodiments that include a curved piezoelectric transducer may facilitate directing sound waves produced by the piezoelectric transducer towards a desired target. In some cases, embodiments that include a curved piezoelectric transducer may facilitate focusing sound waves produced by the piezoelectric transducer at a desired target.

The piezoelectric element may be composed of any convenient materials. For example, the electrode layers may be composed of an electrically conductive material, such as, but not limited to, a metal (e.g., molybdenum (Mo), copper (Cu), silver (Ag), gold (Au), combinations thereof, and the like. In some instances, the electrode layer is composed of molybdenum. In certain embodiments, the piezoelectric layer is composed of a piezoelectric material, such as, but not limited to, the following: a piezoelectric ceramic, e.g., barium titanate ($BaTiO_3$), lead zirconate titanate ($Pb[Zr_xTi_{1-x}]O_3$, where $0 \leq x \leq 1$; PZT), potassium niobate ($KNbO_3$), lithium niobate ($LiNbO_3$, lithium tantalate ($LiTaO_3$), sodium tungstate ($Na_2WO_3$), $Ba_2NaNb_5O_5$, $Pb_2KNb_5O_{15}$, zinc oxide (ZnO), sodium niobate ($NaNbO_3$), potassium niobate ($KNbO_3$), bismuth ferrite ($BiFeO_3$), bismuth titanate $Bi_4Ti_3O_{12}$, sodium bismuth titanate $Na_{0.5}Bi_{0.5}TiO_3$, or combinations thereof; a piezoelectric semiconductor, e.g., GaN, InN, AlN, ZnO, or combinations thereof; or a polymer, e.g., polyvinylidene fluoride (PVDF); or combinations thereof, and the like. In certain embodiments, the piezoelectric layer is composed of aluminum nitride (AlN).

In certain embodiments, the electrode layers of the piezoelectric element may each have a thickness ranging from 1 nm to 1000 nm, such as 5 nm to 900 nm, or 10 nm to 800 nm, or 25 nm to 700 nm, or 50 nm to 600 nm, or 50 nm to 500 nm, or 50 nm to 400 nm, or 50 nm to 300 nm, or 50 nm to 200 nm, or 100 nm to 200 nm. In some cases, an electrode layer of the piezoelectric element (e.g., the bottom electrode, the middle electrode layer, and/or the top electrode) has a thickness ranging from 100 nm to 200 nm, such as 150 nm or 130 nm. In certain embodiments, a piezoelectric layer (e.g., the first piezoelectric layer and/or the second piezoelectric layer) of the piezoelectric element has a thickness ranging from 100 nm to 10 µm, such as 250 nm to 9 µm, or 500 nm to 8 µm, or 750 nm to 7 µm, or 1 µm to 6 µm, or 1 µm to 5 µm, or 1 µm to 4 µm, or 1 µm to 3 µm. In some cases, the piezoelectric layer of the piezoelectric element has a thickness ranging from 1 µm to 3 µm, such as 2 µm. In certain embodiments, a piezoelectric layer (e.g., the first piezoelectric layer and/or the second piezoelectric layer) of the piezoelectric element has a thickness ranging from 100 nm to 10 µm, such as 250 nm to 7 µm, or 500 nm to 5 µm, or 500 nm to 3 µm, or 500 nm to 1 µm, or 500 nm to 1 µm, or 600 nm to 1 µm or 700 nm to 1 µm, or 700 nm to 950 nm, or 710 nm to 950 nm, or 715 nm to 950 nm. In some cases, the piezoelectric layer of the piezoelectric element has a thickness ranging from 715 nm to 950 nm.

The piezoelectric transducer may also include one or more vias for forming an electrical contact to one or more of the electrode layers. For example, the piezoelectric transducer may include a hole through a portion of the overlying piezoelectric layers and/or the overlying middle and/or top electrode layers to form a via exposing a portion of a surface of the bottom electrode layer. Similarly, the piezoelectric transducer may include a via for forming an electrical contact to the middle electrode layer. For instance, the piezoelectric transducer may include a hole through a portion of the overlying piezoelectric layer and/or the overlying top electrode layer to form a via exposing a portion of a surface of the middle electrode layer. In some cases, the piezoelectric transducer includes a via for forming an electrical contact to the inner region of the middle electrode layer. In some cases, the piezoelectric transducer includes a via for forming an electrical contact to the outer region of the middle electrode layer. In some cases, the piezoelectric transducer includes a first via for forming an electrical contact to the inner region of the middle electrode layer, and a second via for forming an electrical contact to the outer region of the middle electrode layer.

Energy & Power Consumption

Embodiments of the piezoelectric transducer (pMUT) find use, e.g., in battery-powered devices, which may require low power dissipation. In some instances, the piezoelectric transducer can have a lower power consumption as compared to typical piezoelectric transducers. By example, a piezoelectric transducer of the present disclosure, in comparison to a typical piezoelectric transducer of the same diameter, uses 1× to 100× less power, such as 10× to 50× less power, for instance 20× less power. In certain embodiments, a piezoelectric transducer of the present disclosure consumes 0.01 mJ to 0.1 mJ or less energy when activated, such as 10 µJ to 100 µJ or less, or 5 µJ to 75 µJ or less, or 1 µJ to 50 µJ or less, or 0.1 µJ to 50 µJ or less. The power consumption of the piezoelectric transducer (or an array containing a plurality of piezoelectric transducers) may vary depending on the application and desired features of the device. For example, a fingerprint sensor that includes a piezoelectric transducer array of the present disclosure may have different power consumptions depending on the resolution, such as, 500 dpi or 300 dpi (e.g., with or without phased array beam forming), and fabrication technology. In some cases, the energy consumption of a piezoelectric transducer array for a single fingerprint scan is about 1 µJ to 40 µJ, such as 5 µJ to 30 µJ, or 10 µJ to 20 µJ, which may be significantly lower energy consumption as compared to a typical planar piezoelectric transducer. Similar differences in power consumption may be present for other applications, such as piezoelectric transducers or piezoelectric transducer arrays used for gesture recognition. In certain embodiments, the piezoelectric transducer uses an AC drive voltage for activation of the piezoelectric transducer. The AC drive voltage used to power the piezoelectric transducer may range from 0.1 V to 50 V, such as 0.1 V to 25 V, or 0.5 V to 10 V, or 1 V to 5 V, including 2 V to 3 V.

Energy consumption of the piezoelectric transducer may also depend on the frequency of use of the piezoelectric transducer. For example, the frequency at which a fingerprint sensor is used may depend on the application, e.g., fingerprint sensors used in smart phones may be used each time the device is activated by the user, typically a few times per hour or day. High security applications may use frequent re-verification, for example each minute, which increases the frequency of use of the piezoelectric transducer. Door locks equipped with fingerprint sensors, e.g., for access to residential homes or automobiles, may be used with less frequency, such as a few times per day.

In certain embodiments, the piezoelectric transducer (e.g., a pMUT array fingerprint sensor) is configured to be activated only when used, which may facilitate a minimization in energy consumption. Activation of the piezoelectric transducer can be controlled, for example with software, by a capacitive sensor, or the piezoelectric transducer array itself. For instance, control of activation by the piezoelectric transducer itself may be achieved by having a single or small number of piezoelectric transducers in an array activated periodically, for example ten times per second. Since only a few piezoelectric transducers out of the entire array are periodically activated, the power dissipation of this operation may be lower than if the entire array was periodically activated (e.g., 0.01 µW or less, depending on the design). For example, if a finger or other object is detected by periodic activation of a portion of the piezoelectric transducers in the array, the entire piezoelectric transducer array can be activated, for example to acquire a fingerprint pattern using the piezoelectric transducer array. The resulting low average power dissipation of the piezoelectric transducer array (e.g., pMUT fingerprint sensor) can facilitate use of the piezoelectric transducer as a replacement for a power switch in certain applications, such as, but not limited to, smart phones. For instance, the device (e.g., smart phone) can be turned on only when a valid fingerprint is recognized by the piezoelectric transducer array, with no other steps needed. This mode of operation can facilitate the convenience and security provided to the user.

The energy stored in a CR2032 lithium coin cell battery is typically 2000 to 3000 Joules, which can provide for tens to hundreds of millions of finger print recognitions. If, for example, the fingerprint sensor is used once per hour, a coin cell battery may last over 400 years if used only for powering the fingerprint sensor. Since smart phone batteries have an order-of-magnitude higher energy capacity than a typical coin cell battery, the addition of a fingerprint sensor with a piezoelectric transducer array to such a device would result in negligible reduction of the running time per battery charge.

An example of the power dissipation of a device employing a piezoelectric transducer array is described below. The actual power dissipation may deviate from this estimate because of variations in the design. A piezoelectric transducer array fingerprint sensor may have a total area of 1 cm by 2 cm. Assuming 500 dpi resolution, the sensor may include an array of 200 by 400 individual piezoelectric transducers.

Energy consumption during a transmit phase may be due to charging and discharging the capacitance of the piezoelectric transducers and resistance in the electrical wiring. Although this capacitance may depend on details of the fabrication technology, the capacitance per piezoelectric transducer may be 1 pF or less. Activating all piezoelectric transducers with 10 V for 4 cycles, thus may consume 1.6 µJ of energy. Depending on requirements of the application, the piezoelectric transducers can be activated all at once, or sequentially, or a combination thereof. Energy consumption may be independent of the activation protocol used. In a phased array mode, the energy consumption may be higher since several (e.g., 10 or more, such as 20 or more, for example 21) pMUTs may be activated to sense a single point.

The energy consumption for reception includes the energy needed for amplifying the signal and the energy needed for analog-to-digital conversion of the signal. Since the receiver may be active for only a short period after an acoustic pulse has been transmitted by the piezoelectric transducers, energy consumption can be reduced by power gating. For example, an acoustic signal traveling 300 µm to 750 µm from the piezoelectric transducer to the dermis and back at a typical sound velocity of 1500 m/s experiences a 200 ns to 500 ns delay, during most of which the receiving amplifier is ready to accept and amplify the echo signal. Assuming 1 mW average power dissipation for an amplifier with approximately 1 GHz bandwidth, the energy required to process the echo signals at all 200 by 400 piezoelectric transducers is 40 µJ. An 8-bit analog-to-digital converter operating at 100 MHz to convert the echo amplitudes to digital signals consumes a similar amount of energy. In summary, the total energy consumption to transmit, receive, and digitize the acoustic signals in a 1 cm by 2 cm piezoelectric transducer array may be equal to about 1.6 µJ+4 µJ+40 µJ, or about 46 µJ if no beam forming is used. With beam forming, the energy may be one to two orders of magnitude larger, depending on the number of piezoelectric transducers activated per beam. Additional energy may be used to process, identify, and validate fingerprints acquired by the piezoelectric transducer array. The level of energy consumption may depend on the processor and the complexity of the algorithms used, and for efficient devices may be about 1 mJ or less.

Electromechanical Coupling

Piezoelectric transducers of the present disclosure may have higher levels of electromechanical coupling as compared to typical planar piezoelectric transducers. The electromechanical coupling of the piezoelectric transducer may depend on the medium through which the signal is transmitted, and also the material from which the piezoelectric transducer is fabricated. This provides flexibility in designing piezoelectric transducers to meet the particular needs of a system (e.g., a sensing system) that includes the piezoelectric transducers. By example, choice of fabrication materials allows balancing costs of materials, ease of manufacture, and performance in design criteria to meet requirements of a final sensing system for specific applications.

In certain embodiments, a piezoelectric transducer electromechanical coupling performance ranges from 0.1% to 100%, such as from 1% to 100%, or from 5% to 100%, or 10% to 100%, or 10% to 90%, or 10% to 80%, or 10% to 70%, to 10% to 60%, or 10% to 50%, or 20% to 50%, or 25% to 45%, or 30% to 45%. For example, a piezoelectric transducer electromechanical coupling performance in air when fabricated with aluminum nitride piezoelectric elements may range from 0.1% to 100%, such as 0.1% to 75%, or 0.1% to 50%, or 0.1% to 25%, or 0.1% to 10%, or 0.1% to 5%, or 0.2% to 4.8%, or 1% to 3%, such as 2%. In other instances, a piezoelectric transducer electromechanical coupling performance in air when fabricated with lead zirconium titanate (PZT) may range from 10% to 50%, such as 20% to 40%, e.g., 30%. In other embodiments, a piezoelectric transducer electromechanical coupling performance in air when fabricated with lead magnesium niobate-lead titanate (PMN-PT) may range from 45% to 100%, such as 50% to 98%, e.g., 90% or 92%. Other materials than those specified in the above examples, as well as alloys or amalgams of two or more of those materials, may be used in designing a piezoelectric transducer to provide the desired characteristics for a specific application.

The present disclosure provides embodiments of bimorph piezoelectric transducers using dual middle electrodes as described above. By "bimorph" is meant that the piezoelectric transducer includes two piezoelectric layers (e.g., a first piezoelectric layer and a second piezoelectric layer, as described above. The piezoelectric transducers may have several features, such as, but not limited to: (1) a complementary metal-oxide semiconductor (CMOS) compatible process with aluminum nitride (AlN) as the piezoelectric layers; and (2) experimentally measured 400% higher output deformation as compared with a conventional unimorph piezoelectric transducer by applying a differential drive scheme using the two active piezoelectric layers. By "unimorph" is meant that the piezoelectric transducer includes one piezoelectric layer.

Figure 2A:
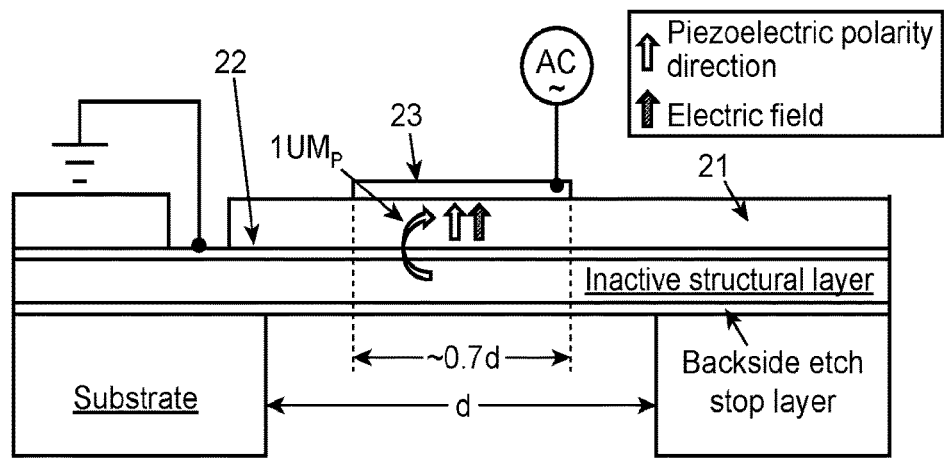
FIG. 2A shows a cross-sectional view of a conventional unimorph pMUT with one active layer.
Figure 2B:
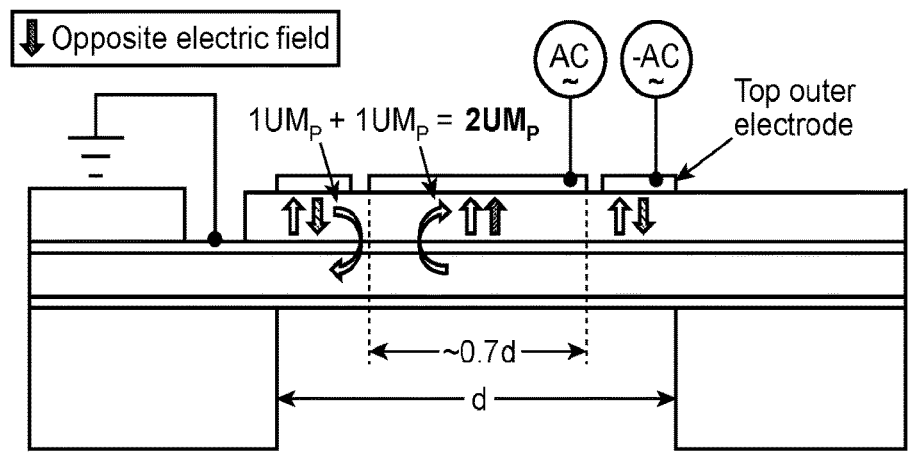
FIG. 2B shows a cross-sectional view of a two-port unimorph pMUT with inner and outer electrodes driven differentially.
Figure 2C:
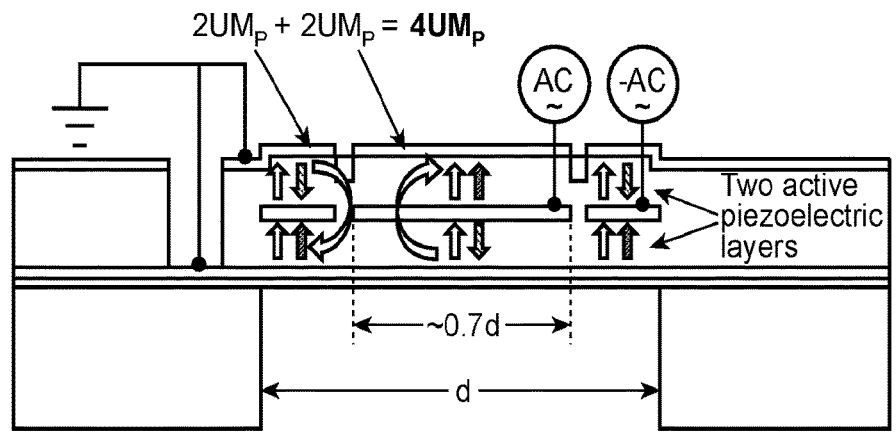
FIG. 2C shows a cross-sectional view of a bimorph pMUT with dual electrodes, according to embodiments of the present disclosure. In certain embodiments, the bimorph pMUT design provides 4× larger output, e.g., a 4× larger bending moment.

FIG. 1 is a 3D schematic diagram illustrating a cross-sectional view of a bimorph piezoelectric transducer (pMUT) design with dual middle electrodes. The bimorph pMUT includes two active piezoelectric layers 10, sandwiched between top 11, bottom 12, and middle electrodes 13, 14. The middle electrodes have a dual-electrode design that includes an inner circular-shaped middle electrode 13 and an outer annular-shape middle electrode 14. In contrast to a conventional unimorph piezoelectric transducer as shown in FIG. 2A, which includes a single active piezoelectric layer 21 between a bottom electrode 22 and a top electrode 23, the bimorph piezoelectric transducer of the present disclosure, as shown in FIG. 2C, includes two active piezoelectric layers with the same polarity separated by a middle electrode layer. The top and bottom electrodes are connected to ground and the middle inner and outer electrodes are driven with AC voltages with equal magnitude but opposite phase as shown. As such, the inner (outer) portion of the diaphragm will be in contraction while the outer (inner) portion of the diaphragm will be in expansion to produce 2× larger volumetric displacement. The two active piezoelectric layers provide an additional 2× larger volumetric displacement as compared with the single-layer structure. As such, 4× higher responses can be generated using a bimorph pMUT of the present disclosure. The bimorph pMUT also includes a backside etch support layer 15 (also referred to a a support layer or bottom support layer herein) on the bottom electrode opposite from the bottom active piezoelectric layer, as shown in FIG. 1.

Figure 3:
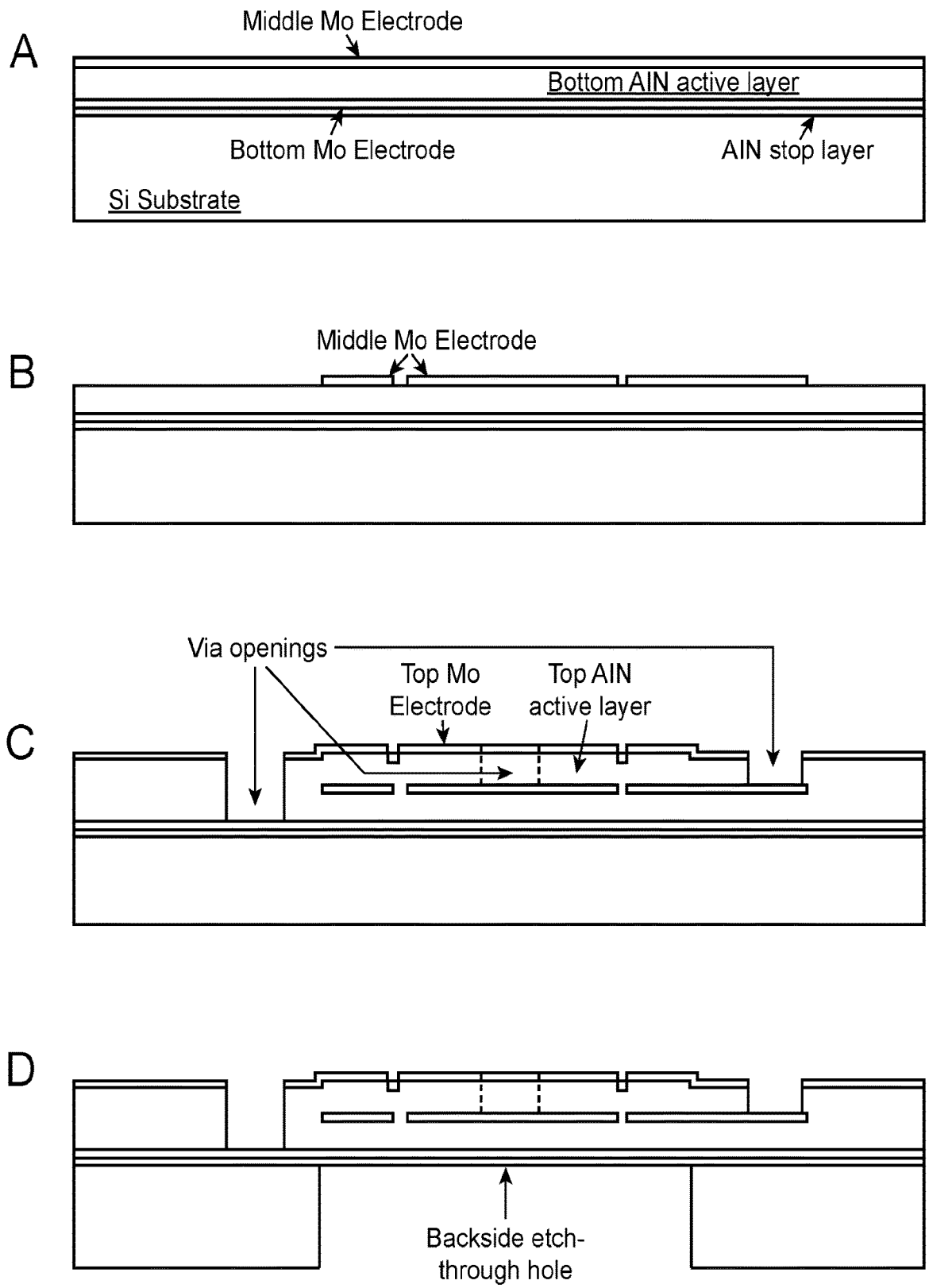
FIG. 3 shows a process flow of the dual electrode bimorph pMUT.

FIG. 3 shows an example of a CMOS-compatible fabrication process for the dual-electrode bimorph pMUT of the present disclosure, starting with: (FIG. 3, panel a) sputter deposition of thin AlN support layer (also referred to herein as a stop layer), bottom Mo electrode layer, first AlN piezoelectric layer, and middle Mo electrode layer; (FIG. 3, panel b) patterning of middle electrodes; (FIG. 3, panel c) sputter deposition of the second AlN piezoelectric layer and top Mo electrode layer and via openings to the middle and bottom electrodes; and (FIG. 3, panel d) backside deep reactive ion etching (DRIE) to release the piezoelectric transducer. The backside etch-through hole forms the circular diaphragm and defines its diameter. The two middle electrodes are separated via a small gap as an inner circular-shape middle electrode and outer annular-shape middle electrode, which are electrically isolated and can be differentially actuated with two voltage sources of the same amplitude and opposite polarity.

As described above, FIG. 2A illustrates a conventional unimorph piezoelectric transducer with an inactive structural layer, a single active piezoelectric layer 21, a bottom electrode 22, and a top circular electrode 23. Under an electric field between the top and bottom electrodes, an in-plane electromechanical strain is induced by the piezoelectric d31 effect. The strain profile generates a 1 $UM_p$ bending moment ($UM_p$ is defined as an arbitrary unit of bending moment per unit input voltage) on the diaphragm and makes it move out-of-plane, i.e., in a flexural mode. A conventional dual-electrode unimorph piezoelectric transducer with a single piezoelectric layer between a bottom electrode and a top electrode with an inner circular region and outer annular region is shown in FIG. 2B. When driven differentially with voltage sources of the same magnitude and opposite polarity, the inner (outer) portion of the diaphragm will be in contraction while the outer (inner) portion will be in expansion to generate a 2 $UM_p$ bending moment. In these single active-layer devices, the electromechanical energy transformation comes from the single piezoelectric layer and some of the energy is used to mechanically deform the inactive structural layer.

In contrast to the conventional unimorph pMUT structure, the bimorph pMUT of the present disclosure includes two active piezoelectric layers, as shown in FIG. 2C, with the same polarity and separated by a patterned middle electrode. The top and bottom electrodes are connected to ground and the middle inner and outer electrodes are driven with AC voltages with equal magnitude but opposite phase. As such, in addition to the 2× displacement produced by the differential dual electrode similar to the case in FIG. 2B, the two active piezoelectric layers provide an additional 2× larger volumetric displacement as compared with the single-layer structure. In other words, each layer generates 2 $UM_p$ on the diaphragm while operating in the differential mode and a total of 4 $UM_p$ will be imposed on the diaphragm. As such, 4× higher responses can be produced by the piezoelectric transducers of the present disclosure.

Piezoelectric Transducer Devices

Aspects of the present disclosure include devices that have one or more piezoelectric transducers as disclosed herein. In certain embodiments, the piezoelectric transducers may be arranged as an array of piezoelectric transducers. For instance, an array of piezoelectric transducers may be provided on a substrate, where the substrate can be a substrate as described herein.

An "array" includes any two-dimensional or substantially two-dimensional (as well as a three-dimensional) arrangement of piezoelectric transducers. In some instances, the piezoelectric transducers form addressable regions, e.g., spatially addressable regions. An array is "addressable" when it has multiple piezoelectric transducers positioned at particular predetermined locations (e.g., "addresses") on the array. Array features (e.g., piezoelectric transducers) may be separated by intervening spaces. Any given substrate may carry 1, 2, 3, 4, 5, 6, 7, 8, 9, 10, or more arrays disposed on a surface of the substrate. Depending upon the use, any or all of the arrays may be the same or different from one another and each may contain multiple distinct piezoelectric transducers. An array may contain one or more, including two or more, four or more, 8 or more, 10 or more, 50 or more, 100 or more, 150 or more, 200 or more, 250 or more, 300 or more, 350 or more, 400 or more, 450 or more, 500 or more, 550 or more, 600 or more, 650 or more, 700 or more, 750 or more, 800 or more, 850 or more, 900 or more, 950 or more, 1000 or more, 1250 or more, 1500 or more, 2000 or more, 2500 or more, 3000 or more, 4000 or more, 5000 or more, 6000 or more, 7000 or more, 8000 or more, 9000 or more, or 10,000 or more piezoelectric transducers. In certain embodiments, the piezoelectric transducers can be arranged into an array with an area of 10 $cm^2$ or less, or 5 $cm^2$ or less, e.g., 1 $cm^2$ or less, including 50 $mm^2$ or less, or 20 $mm^2$ or less, such as 10 $mm^2$ or less, or 5 $mm^2$ or less, or even smaller. For example, a piezoelectric transducer array may have dimensions in the range of 10 mm×10 mm, such as 7 mm×7 mm, or 5 mm×5 mm, or 3 mm×5 mm, or 3 mm×3 mm. For instance, in some cases as described herein, a piezoelectric transducer may have a diameter of about 500 μm, and may be arranged in an array of a plurality of piezoelectric transducers, such as an array of 6×60 piezoelectric transducers (e.g., an array containing 360 piezoelectric transducers arranged in an array of 6 piezoelectric transducers by 60 piezoelectric transducers. In some instances, multiple arrays may be arranged on the same substrate. For example, ten 6×60 arrays of piezoelectric transducers may be arranged on a substrate to form a larger 60×60 array of piezoelectric transducers.

In certain embodiments, the device that includes a piezoelectric transducer or an array of piezoelectric transducers is a portable device. For example, the device that includes a piezoelectric transducer or an array of piezoelectric transducers may be a hand-held device (e.g., a device that may be held and operated by a single hand or by two hands of a user). In some instances, the device that includes a piezoelectric transducer or an array of piezoelectric transducers is a battery operated device. A battery operated device may be powered from one or more batteries contained in the device or electrically connected to the device. In some cases, a battery operated device does not require a connection to a power outlet to have sufficient power to operate. In some instances, the battery operated device may include rechargeable batteries that may be connected to a power source as needed to replenish the electrical charge of the rechargeable batteries.

Devices that include a piezoelectric transducer or an array of piezoelectric transducers may vary and can include any such device where a piezoelectric transducer or an array of piezoelectric transducers finds use. Examples of devices that may include a piezoelectric transducer or an array of piezoelectric transducers include, but are not limited to, sensor devices, such as gesture recognition sensors (e.g., gesture recognition sensors in cell phones, tablet computers, personal computers, video game systems, etc.), fingerprint detection sensors (e.g., fingerprint detection sensors in cell phones, tablet computers, personal computers, security systems, etc.), body motion sensors, sensors for measuring liquid and/or gas velocity, sensors for measuring speed through air or water, distance sensors (e.g., automotive sensors for parking assist technology), location sensors (e.g., sonar, underwater range finders, Ultrasound Identification (USID), Real Time Locating System (RTLS), or Indoor Positioning System (IPS)), sensors for detecting uneven surfaces, alarm sensors (e.g., burglar alarm sensors, motion detectors), sensors for liquid measurement (e.g., sensors for liquid tank or channel level measurements), touchless sensing devices (e.g., sensors for non-destructive testing, level sensors or sensing systems that require no contact with the target, etc.), and the like.

Examples of other types of devices that may include a piezoelectric transducer or an array of piezoelectric transducers include, but are not limited to, ultrasonic transducer devices, e.g., devices that convert energy into ultrasound. For example, the piezoelectric transducer or array of piezoelectric transducers may be use do produce ultrasound. Ultrasonic transducer devices can apply the generated ultrasound to a subject or an object. For example, ultrasonic transducer devices include, but are not limited to, ultrasonic impact treatment (UIT) devices (e.g., devices that use ultrasound to enhance the mechanical and/or physical properties of metals), devices for processing of liquids and slurries, ultrasound cleaning devices, humidifiers, defrosters, medical ultrasound devices (e.g., medical ultrasound imaging devices), and the like.

Thus, in certain embodiments, the sound waves generated by the subject piezoelectric transducers, arrays thereof, devices that include such, may be ultrasound waves. By "ultrasound" is meant that the sound waves have a frequency greater than the upper limit of the human hearing range. For example, ultrasound may have a frequency of 20 kHz or more, such as 50 kHz or more, or 100 kHz or more, or 250 kHz or more, or 500 kHz or more, or 750 kHz or more, or 1 MHz or more, or 10 MHz, or more, or 25 MHz or more, or 50 MHz or more, or 100 MHz or more, or 250 MHz or more, or 500 MHz or more, or 750 MHz or more, or 1 GHz or more, or 5 GHz or more, or 10 GHz or more, or 25 GHz or more, or 50 GHz or more, or 75 GHz or more, or 100 GHz or more. In certain instances, a subject medical device produces ultrasound with a frequency ranging from 200 kHz to 100 MHz, such as 200 kHz to 75 MHz, or 250 kHz to 50 MHz, or 250 kHz to 25 MHz, or 250 kHz to 10 MHz.

Devices that include a piezoelectric transducer or an array of piezoelectric transducers may also include devices used for the transmission of data (e.g., CDMA cellphones). For instance, a piezoelectric transducer or an array of piezoelectric transducers may be used in an electronic device for the ultrasonic transmission of data from one electronic device to another electronic device.

Methods

Methods of making a piezoelectric transducer are provided. In certain embodiments, the methods of making a piezoelectric transducer include producing a piezoelectric element on a support layer. The support layer may be present on a surface of a substrate as described herein.

In certain embodiments, the methods of making the piezoelectric transducer include processes compatible with CMOS fabrication protocols. For example, the methods of making the piezoelectric transducer may include one or more processes, such as etching, lithography, physical deposition, chemical deposition, combinations thereof, and the like. Deposition processes as described herein may include any convenient thin film deposition processes, such as, but not limited to, chemical vapor deposition (CVD), physical vapor deposition (PVD), sputtering, combinations thereof, and the like.

In certain aspects, the method of making a piezoelectric transducer begins with a substrate as described herein. The piezoelectric transducer may be produced on a surface of the substrate. In certain embodiments, the method of making the piezoelectric transducer includes depositing a support layer on the substrate. The support layer may be any support layer as described herein.

The method of making the piezoelectric transducer may further include depositing a piezoelectric element on the support layer. As described herein, a piezoelectric element may include multiple layers, such as a bottom electrode layer, a first piezoelectric layer, a middle electrode layer, a second piezoelectric layer, and a top electrode layer. The layers of the piezoelectric element may be deposited on the support layer to form the piezoelectric element on a surface of the support layer.

In some instances, the method of making the piezoelectric transducer further includes removing substrate material from an opposing surface of the substrate. The opposing surface may be a surface opposite from the substrate surface where the support layer and piezoelectric element are deposited. In some instances, removing substrate material from the opposing surface of the substrate produces an opening (also referred to herein as a via, a hole or a backside hole) through the substrate. As described herein, the opening through the substrate may expose a portion of the support layer. For instance, the exposed surface of the support layer may be the surface of the support layer opposite from the surface where the piezoelectric element is deposited.

In certain embodiments, the method of making the piezoelectric transducer further includes forming an electrical contact to the bottom electrode layer of the piezoelectric element, forming an electrical contact to the middle electrode layer of the piezoelectric element, and forming an electrical contact to the top electrode layer of the piezoelectric element. To form an electrical contact to the bottom electrode layer, the method may also include removing a portion of the overlying piezoelectric layers and/or the overlying middle and/or top electrode layers to form a hole or via exposing a portion of the surface of the bottom electrode layer. In some instances, removing a portion of the overlying piezoelectric layers and the overlying middle and/or electrode layer includes etching hole or via to expose a portion of the surface of the bottom electrode layer.

Similarly, an electrical contact may be formed to the middle electrode layer. To form an electrical contact to the middle electrode layer, the method may also include removing a portion of the overlying piezoelectric layer (e.g., the second piezoelectric layer as described herein) and/or the overlying top electrode layer to form a hole or via exposing a portion of the surface of the middle electrode layer. In some instances, removing a portion of the overlying piezoelectric layer and the overlying top electrode layer includes etching hole or via to expose a portion of the surface of the middle electrode layer.

In certain embodiments, the method of making the piezoelectric transducer is CMOS-compatible. For example, aluminum nitride is a CMOS-compatible material. Additionally, the diameter can be controlled through the fabrication process (e.g., the etching steps as described above). By defining the diameter of the backside hole though the substrate, the size of the average diameter of the piezoelectric transducer can be defined. The resonant frequency of the piezoelectric transducer may depend on the diameter of the piezoelectric transducer (e.g., the diameter of the portion of the piezoelectric transducer exposed through the backside hole through the substrate). This allows fabrication of a device with a defined resonant frequency suitable to a particular desired purpose.

The thickness of the piezoelectric element can be controlled during the fabrication process by timed sputtering deposition of aluminum nitride. More time produces a thicker aluminum nitride. The diameter of the piezoelectric transducer can be controlled with different fabrication parameters, such as, but not limited to, time, and a combination of the backside etching process (e.g., hydrofluoric/nitric/acetic acid (HNA) etching). Embodiments of the presently disclosed fabrication methods may facilitate control of the size of the piezoelectric transducer, which provides the ability to produce a piezoelectric transducer having a desired resonant frequency for a particular desired purpose or application.

An example of a fabrication process flow chart for producing a piezoelectric transducer of the present disclosure is shown in FIG. 3. FIG. 3 shows a CMOS-compatible process flow chart for a dual-electrode bimorph pMUT, starting with: (FIG. 3, panel a) sputter deposition of 200 nm-thick AlN stop layer, 150 nm-thick Mo bottom electrode, first 0.95 µm-thick AlN active piezoelectric layer, and 150 nm-thick middle Mo electrode; (FIG. 3, panel b) patterning the middle electrodes by plasma etching using SF6; (FIG. 3, panel c) sputter deposition of the second 0.95 µm-thick AlN piezoelectric layer, and 150 nm-thick top Mo electrode. The via openings to both the middle and bottom electrodes may be subsequently formed using fluorine-based plasma to etch the Mo electrode. Chlorine-based plasma can be used to etch the AlN piezoelectric layer, in combination with a final wet etching step with MF-319 to remove the remaining AlN and facilitate a minimization in damage and maximization in selectivity to the Mo electrodes; and finally (FIG. 3, panel d) backside DRIE to release the diaphragm from the underlying substrate.

Aspects of the present disclosure include methods of using the piezoelectric transducers disclosed herein. In some embodiments, methods of using a piezoelectric transducer include producing sound waves from a piezoelectric transducer, where the piezoelectric transducer is configured to direct the produced sound waves to a target. As such, methods of using the subject piezoelectric transducers may include producing sound waves from the piezoelectric transducer, and directing the produced sound waves towards a target.

As described herein, a differential drive method may be used during use of the piezoelectric transducers disclosed herein. During differential drive operation, the inner region and the outer region of the middle electrode layer are driven (e.g., driven with AC voltages) with equal magnitude but opposite phase. As such, the method of operating the piezoelectric transducer may include applying voltages having opposite phase to the inner region and the outer region of the middle electrode layer. In these instances, the induced stresses in the piezoelectric element may have opposite signs, thus producing a 2× larger bending moment in the piezoelectric element as compared to a conventional unimorph piezoelectric transducer.

In some cases, the produced sound waves are ultrasound waves. The target for the produced sound waves may be any desired target and may depend on the type of device being used. For instance, as described herein devices that include a piezoelectric transducer may include sensor devices, and as such the target may be the subject being sensed by the sensor device, such as, but not limited to, a finger (e.g., a fingerprint), a liquid, an automobile, a person, an animal, or any other target that may be detected by the sensor device. Other devices that may include a piezoelectric transducer are ultrasonic transducer devices, and as such, the target may be a substrate or liquid being treated or modified by the ultrasound waves produced by the ultrasonic transducer device.

Utility

As described herein, the subject bimorph piezoelectric transducer is a bimorph piezoelectric micromachined ultrasonic transducer (pMUT) that includes two active piezoelectric layers. In some instances, the piezoelectric layers have the same polarity and are separated by a middle electrode.

In certain embodiments, the subject bimorph pMUT facilitate an enhancement of the displacement per unit input voltage, acoustic pressure output, and electromechanical coupling by 2×. In some instances, the performance of the piezoelectric transducer can be further increased by 2× using differential actuation of the two portions of the middle electrode. For example, the two piezoelectric layers may have the same piezoelectric polarity, but during use, the electric fields induced by the inner region and the outer region of the middle electrode layer may be in opposite directions. In these instances, the induced stresses in the piezoelectric element may have opposite signs, thus producing a 2× larger bending moment in the piezoelectric element as compared to a conventional unimorph piezoelectric transducer. In some instances, the subject piezoelectric transducer also facilitates an increase in the linearity by 10× as compared with unimorph piezoelectric transducer. In some instances, the subject piezoelectric transducer also facilitates an increase in the resonant displacement as compared to conventional piezoelectric transducers. For example, a piezoelectric transducer of the present disclosure may have a resonant displacement of 100 nm/V or more, such as 150 nm/V or more, or 200 nm/V or more, or 250 nm/V or more, or 300 nm/V or more, or 350 nm/V or more, or 400 nm/V or more, or 450 nm/V or more, or 500 nm/V or more, or 550 nm/V or more, or 600 nm/V or more, or 650 nm/V or more, or 700 nm/V or more, or 750 nm/V or more, or 800 nm/V or more, or 850 nm/V or more, or 900 nm/V or more, or 950 nm/V or more, or 1000 nm/V or more. In some cases, a piezoelectric transducer of the present disclosure has a resonant displacement of 400 nm/V or more.

As described above, the piezoelectric transducer may include a support layer (e.g., a bottom support layer (also referred to herein as a stop layer or etching stop layer)). The support layer may be disposed on a surface of the bottom electrode layer opposite the first piezoelectric layer. In some cases, the support layer may be composed of aluminum nitride (AlN), such as a thin AlN sputtered film. As described above, the support layer may facilitate the production method by providing a stop layer (e.g., an etching stop layer) during the backside etching step. The support layer (stop layer) may be configured to substantially prevent significant etching of the piezoelectric transducer (e.g., piezoelectric layers and/or electrode layers) during an etching step of the production method for the piezoelectric transducer, such as a backside etching step in the production method. In addition, as described above, the production method for the subject piezoelectric transducer may also facilitate production of vias to the bottom and middle electrode layers by a two-step etching process to form the electrode contacts to the bottom and middle electrode layers.

The subject piezoelectric transducers, piezoelectric transducer arrays, devices that include the piezoelectric transducers, and methods of using the piezoelectric transducers find use in a variety of applications, such as applications where the conversion of energy into sound is desired. In some instances, the sound produced by the piezoelectric transducers is ultrasound. As such, the subject piezoelectric transducers find use in applications where the conversion of energy into ultrasound is desired.

For example, the piezoelectric transducers of the present disclosure can find varying applications such as, but not limited to, ultrasonic gesture recognition, range finding, finger print identification, medical imaging, medical diagnosis and therapeutic devices, sensors in handheld devices, energy harvesters, and the like.

Examples of applications where the conversion of energy into sound (e.g., ultrasound) is desired include fingerprint detection and body motion sensors, as well as various sensor devices as described herein. Thus, the subject piezoelectric transducers, devices and methods find use in applications where the detection of a target using sound (e.g., ultrasound) is desired. Other examples of applications where the conversion of energy into sound (e.g., ultrasound) is desired include ultrasonic transducer devices where ultrasound is applied to a target to modify the target. Thus, the subject piezoelectric transducers, devices and methods find use in applications where the modification of mechanical and/or physical properties of a target using ultrasound is desired. Further examples of applications where the conversion of energy into sound (e.g., ultrasound) is desired include data transmission via sound waves (e.g., ultrasound waves). Thus, the subject piezoelectric transducers, devices and methods find use in applications where the transmission of data via sound waves (e.g., ultrasound waves) is desired.

The subject piezoelectric transducers, devices and methods also find use in applications where a reduction in the energy and power consumption of an ultrasonic transducer device is desired. As described herein, the subject piezoelectric transducers have energy and power consumption requirements that may be orders of magnitude lower than conventional piezoelectric transducers. The subject piezoelectric transducers, devices and methods also find use in applications where post-processing tuning, e.g., when pMUTs are used in an array configuration, is desired. The subject piezoelectric transducers, devices and methods also facilitate an increase in electromechanical coupling, and thus find use in applications where an increase in the efficiency of an ultrasonic transducer is desired. The subject piezoelectric transducers, devices and methods also facilitate an increase in responsivity, and thus find use in applications where a high response and sensitivity is desired.

Additional applications of the piezoelectric transducer and/or array of piezoelectric transducers in a micromachined ultrasonic transducer (MUT) Fingerprint Sensor System are described in more detail in U.S. Provisional Patent Application No. 61/846,925, filed Jul. 16, 2013, the disclosure of which is incorporated by reference herein. Additional applications of the piezoelectric transducer and/or array of piezoelectric transducers in In-Air Ultrasonic Rangefinding and Angle Estimation System are described in more detail in U.S. Provisional Patent Application No. 61/776,403, filed Mar. 11, 2013, the disclosure of which is incorporated by reference herein. In these fingerprint and rangefinding sensor systems, the conventional pMUTs used in those systems may be replaced by the piezoelectric transducer and/or array of piezoelectric transducers described herein.

As can be appreciated from the disclosure provided above, embodiments of the present disclosure have a wide variety of applications. Accordingly, the examples presented herein are offered for illustration purposes and are not intended to be construed as a limitation on embodiments of the present disclosure in any way. Those of ordinary skill in the art will readily recognize a variety of noncritical parameters that could be changed or modified to yield essentially similar results. Thus, the following examples are put forth so as to provide those of ordinary skill in the art with a complete disclosure and description of how to make and use embodiments of the present disclosure, and are not intended to limit the scope of what the inventors regard as embodiments of the present disclosure nor are they intended to represent that the experiments below are all or the only experiments performed. Efforts have been made to ensure accuracy with respect to numbers used (e.g. amounts, temperature, etc.) but some experimental errors and deviations should be accounted for. Unless indicated otherwise, parts are parts by weight, molecular weight is weight average molecular weight, temperature is in degrees Celsius, and pressure is at or near atmospheric.

EXAMPLES

Example 1

Summary

Bimorph piezoelectric micromachined ultrasonic transducers (pMUTs) were made by utilizing a two active AlN layers structure constructed in a CMOS-compatible process. The device had two 0.95 μm thick AlN layers sandwiched by three 0.15 μm thick Mo electrodes. In the device, both an inner circular and an outer annular electrode were produced on a 230 μm radius, circular-shape diaphragm. When actuated with the inner electrode of 160 μm radius, the pMUT had a resonant frequency of 198.8 kHz and central displacement of 407.4 nm/V. Under the differential drive scheme using the dual-electrodes for large acoustic outputs at a low frequency, the measured central displacement was 13.0 nm/V, which was about 400% higher than that of a unimorph AlN pMUT under similar actuation conditions. As such, the dual-electrode bimorph pMUT had improved operation as compared with a flat pMUT design to achieve enhanced acoustic outputs.

Fabrication Results

Figure 4:
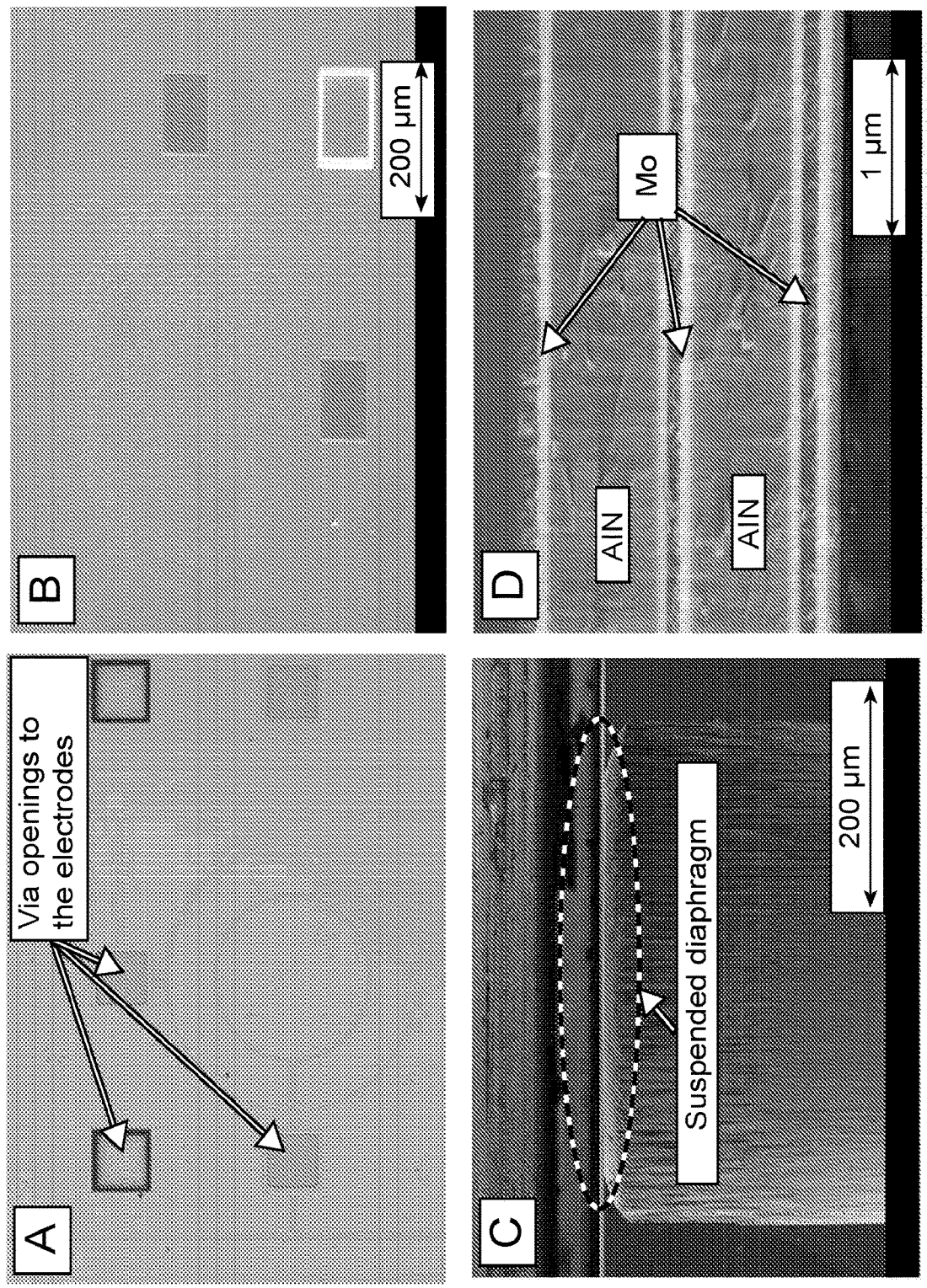
FIG. 4, panel a, shows an optical top view image, and FIG. 4, panel b, shows a tilted view scanning electron microscopy (SEM) micrograph of a dual electrode bimorph pMUT, according to embodiments of the present disclosure.

FIG. 4, panel a, and FIG. 4, panel b, show the respective optical and SEM top view images of a bimorph pMUT with dual electrode configuration fabricated as shown in FIG. 3. Imprints on the top electrodes were apparent on the images, which were related to the step height variations by underlying middle electrodes. FIG. 4, panel c, shows a cross-sectional SEM micrograph of a cleaved device illustrating the clamped diaphragm. FIG. 4, panel d, is a close-up view of the diaphragm showing its layer composition, and indicating that the suspended AlN diaphragm stack had good crystal alignment in both active AlN layers.

Figure 5:
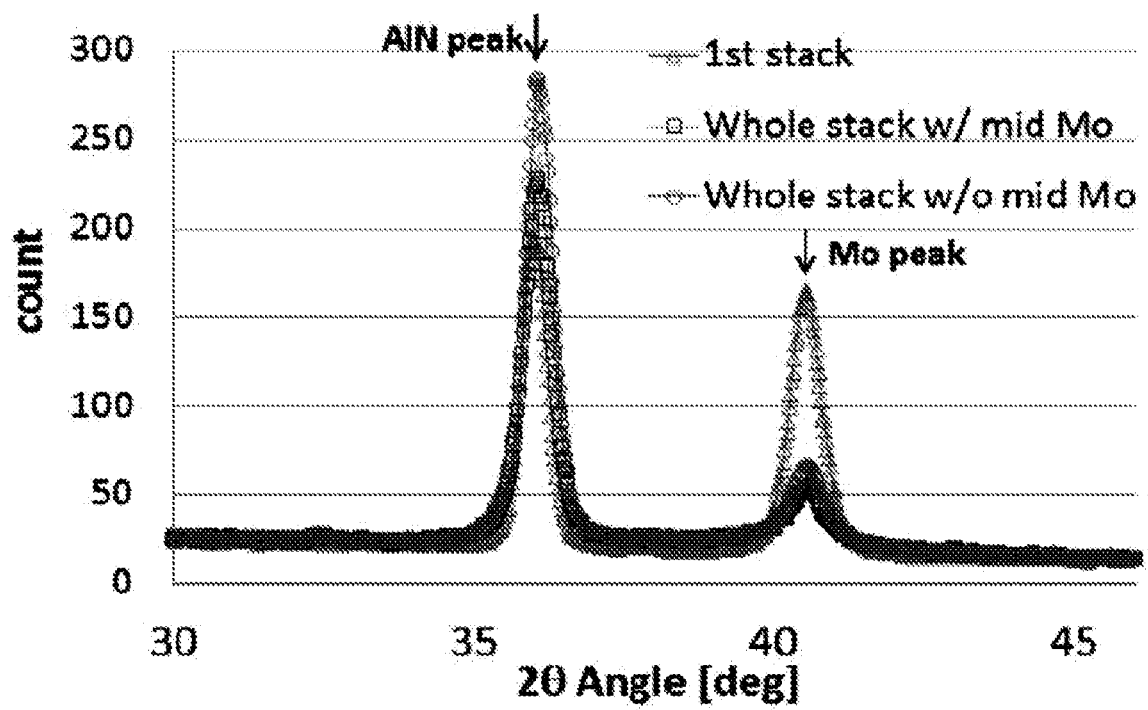
FIG. 5 shows a graph of an X-ray diffraction (XRD) 2θ scan of first AlN layer stack and the whole AlN stack with and without the middle electrode, according to embodiments of the present disclosure.

The crystalline quality of the two active AlN layers was further investigated using XRD (X-Ray Diffractometer), with analysis of the second AlN layer sputtered on top of the patterned middle Mo electrode as the structure was exposed to the external environment before the deposition of the second AlN active layer. Good crystal orientation of both AlN active layers was shown for the bimorph pMUT. FIG. 5 shows the XRD 2θ scans for the first sputtered AlN layer, and the total stack with both AlN layers. The XRD data for the total stack were collected at two different locations, the first of which was where the middle Mo electrode was sandwiched between the AlN layers, and the second of which was where the middle Mo electrode was etched away and the two AlN layers were in direct contact. Good crystallinity data of the first AlN layer and the whole stack were observed in FIG. 5 at the two different scan locations. Although the XRD measurements did not reveal explicit information about the quality of the second sputtered layer, the crystalline information of the second sputtered layer was estimated by comparing the collected data of the first AlN layer to the whole stack. It was observed from FIG. 5 that the whole stack had a sharper peak, higher amplitude, and slightly narrower FWHM in the (002) crystalline direction than that of the first AlN layer, which indicated that the second sputtered layer was as well oriented as the first layer. The FWHM of AlN was measured to be about 1.7° from the Rocking Curve.

Results and Discussion

Figure 6:
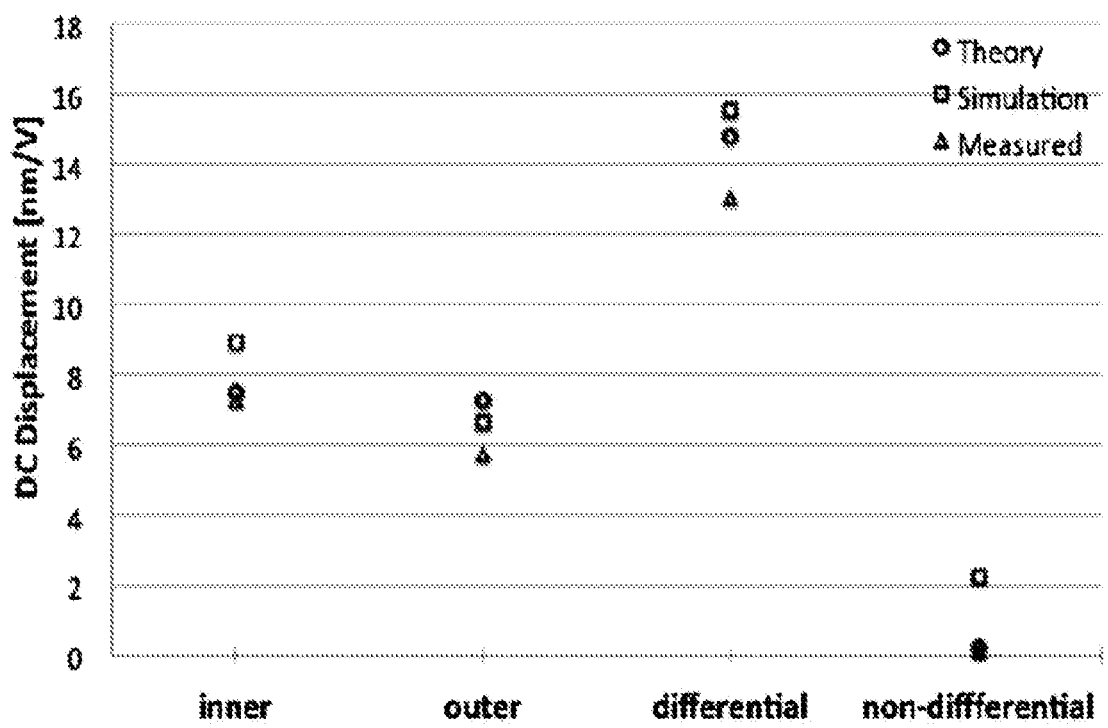
FIG. 6 shows a graph of the low frequency displacement of a bimorph pMUT with 206 kHz resonant frequency with measured, theoretical, and simulated results using (1) inner electrode, (2) outer electrode, (3) differential drive, and (4) non-differential (in phase) actuation, according to embodiments of the present disclosure.

FIG. 6 shows a graph comparing the measured, theoretically derived, and simulated low frequency center displacements of a bimorph pMUT under different driving inputs by (a) inner electrode; (b) outer electrode; (c) out-of-phase drive (differential); and (d) in-phase (non-differential) actuation. In all driving methods, both top and bottom electrodes were grounded while inner and/or outer middle electrodes were actuated.

The dynamic responses were experimentally measured using a laser Doppler vibrometer (LDV) for a pMUT with the stack compositions and thicknesses with inner circular electrode radius of 160 µm and outer annular electrode radius of 230 µm, as described above (pMUT #1). Under the drive of the inner electrode, the DC displacement was theoretically predicted as 7.49 nm/V and experimentally measured as 7.26 nm/V. Under the outer electrode drive, the DC displacement was theoretically predicted as 7.27 nm/V and experimentally measured as 5.75 nm/V. Theoretically, the inner and outer drive should realize similar DC displacement per unit input voltage if the electrode areas were the same (the inner circular electrode radius was 70% of the pMUT diaphragm radius). The discrepancy in the measured values was attributed to a backside over etch which resulted in larger diaphragm than the original design. Under the differential drive operation, the measured DC displacement was 13.01 nm/V, only 11.9% lower than the theoretically predicted value of 14.76 nm/V. The differential drive mode produced roughly 2× larger displacement per unit input voltage compared with the result from single electrode actuation. Under the in-phase actuation, the DC displacement had a negligible value of 0.11 nm/V, indicating that the middle electrodes of the dual electrode bimorph pMUT produced significantly higher displacements.

Figure 7:
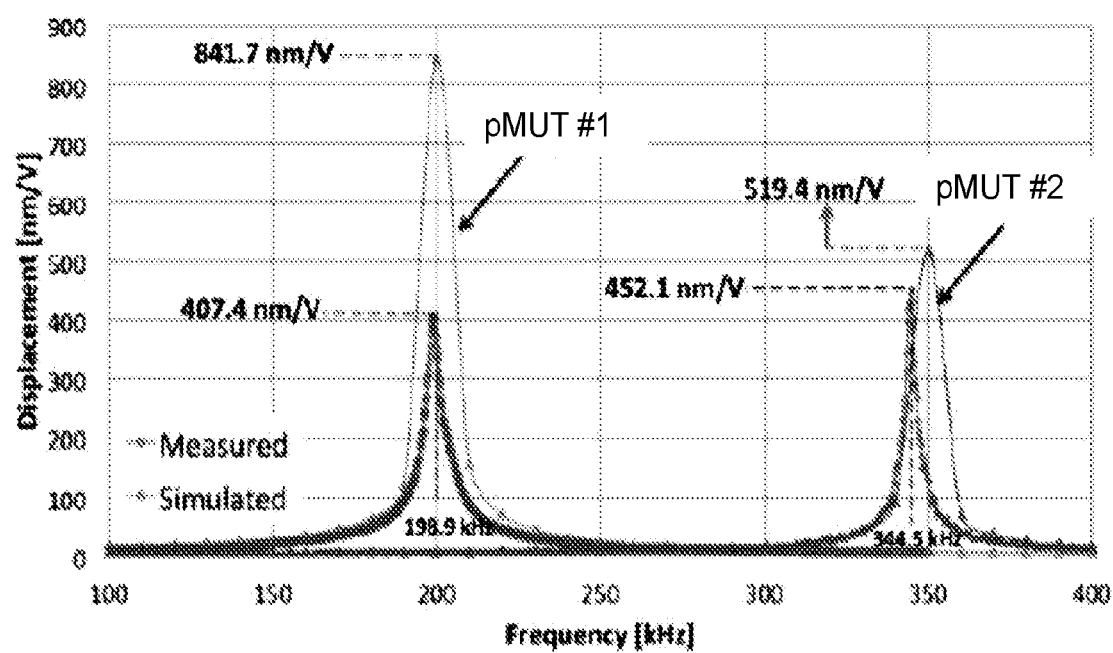
FIG. 7 shows a graph of measured and simulated results of two bimorph pMUTs actuated by the inner electrode with 230 μm and 170 μm in radii and resonant frequencies of 198.9 kHz and 344.5 kHz, respectively, according to embodiments of the present disclosure.

FIG. 7 shows a graph comparing the simulated and measured frequency responses of two bimorph pMUTs; pMUT #1 described above, and pMUT #2 described here. When the radius of the pMUT was reduced to 170 µm (pMUT #2), a 452 nm/V center displacement was measured under resonance at 344 kHz. In comparison, the measured center displacement was 407.4 nm/V under resonance at 198.9 kHz for pMUT #1. This was 51% lower than the simulated value in air medium of 841.7 nm/V but was still about 4× larger than the reported results of prior unimorph flat AlN pMUTs with similar dimensions and frequency. The reduced experimental performance as compared to the simulated values was related to the high residual stress (60 MPa tensile), which increased material damping. It was noted that the residual stress effect was more prominent for pMUTs with larger diaphragms.

TABLE 1

Resonant displacement and resonant frequency of unimorph and bimorph pMUTs.

|  | Resonant Displacement (nm/V) | Center Frequency (kHz) |
| --- | --- | --- |
| Unimorph with annular electrode | 86 | 291 |
| Unimorph with central electrode | 104 | 291 |
| Unimorph with two port differential drive | 188 | 291 |
| bimorph pMUT | 452 | 345 |

Table 1 compares the performances of conventional unimorph pMUTs with the same frequency ranges and a bimorph pMUT of the present disclosure. Table 1 shows that the bimorph pMUT with dual electrodes had superior performance because it had higher displacements per input voltage at higher resonant frequencies. The generated acoustic pressure was proportional to the combination of operation frequency and volumetric displacement. Thus, bimorph pMUTs generated higher pressure at higher frequency for high acoustic power transmission.

Example 2

Dual Electrode Bimorph pMUT (DEB pMUT)

Figure 8:
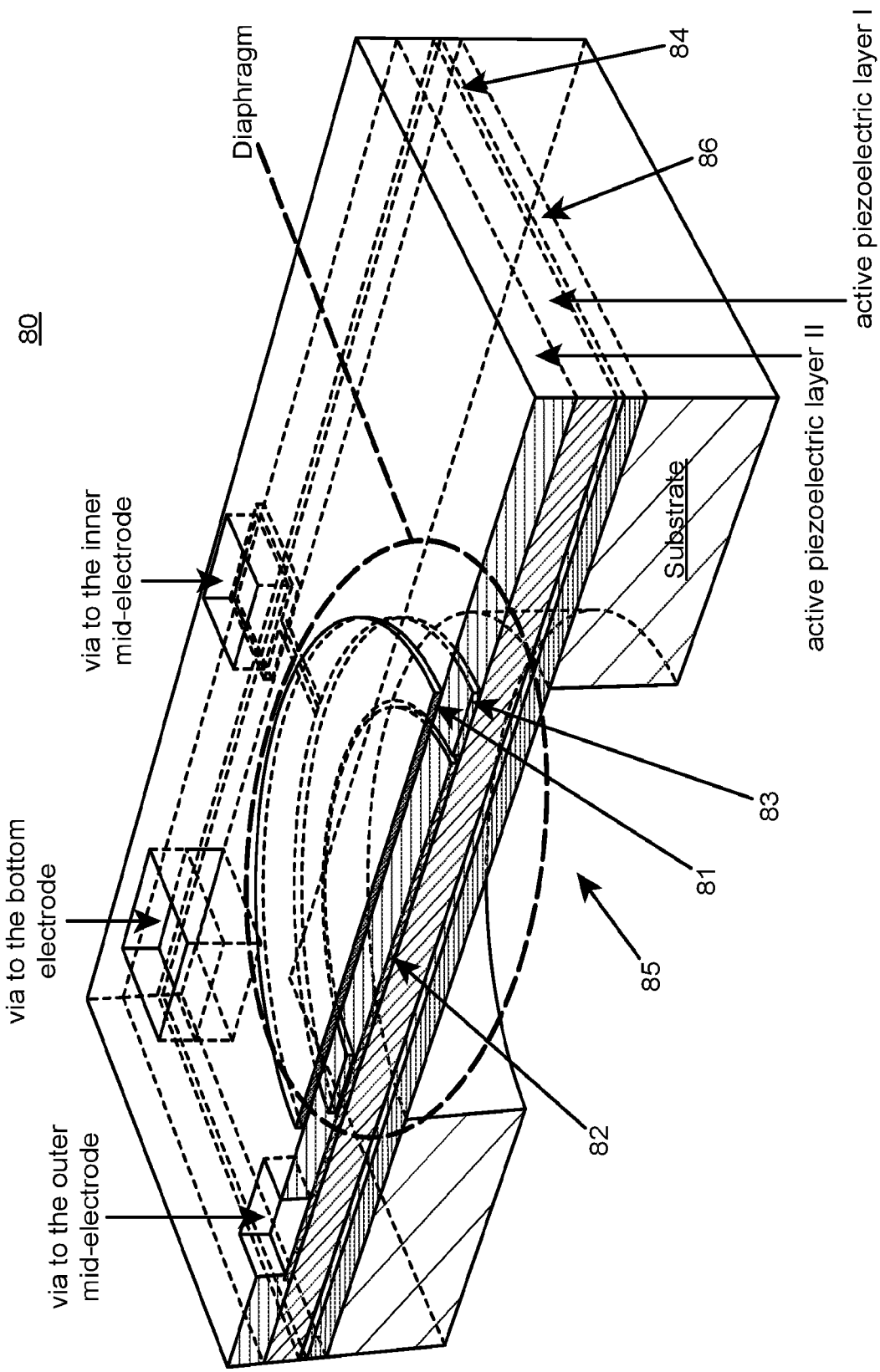
FIG. 8 shows a 3D schematic of a dual electrode bimorph pMUT (DEB pMUT) (cross-sectional view) that includes two active piezoelectric layers and a dual-electrode configuration: inner circular and outer annular middle electrodes, with top and bottom electrodes, according to embodiments of the present disclosure.

FIG. 8 shows a 3D schematic of a DEB pMUT (cross-sectional view) 80. The device includes two active piezoelectric layers and four electrodes: top electrode 81, inner circular middle electrode 82, outer annular middle electrode 83, and bottom electrode 84. Via etches are used to expose the buried middle and bottom electrodes for electrical connections. The backside etch-through hole 85 is formed to release the diaphragm and to define the circular-shaped clamped boundaries. A thin inactive AlN layer, which is nearly impervious to the backside etch chemistry, is used as a backside etch-stop layer 86 at the bottom of the diaphragm. The inner and outer middle electrodes are separated by a small gap and are driven differentially, while the top and bottom electrodes are grounded. The piezoelectric-induced strain gradient in the active layers causes the diaphragm to deform and move in flexural mode, producing acoustic waves in the contact medium.

In order to illustrate the operation of a DEB pMUT of the present disclosure, the working principles of a conventional unimorph pMUT and a conventional dual-electrode unimorph pMUT are described first. A model was used to compare the performances of conventional pMUTs and a DEB pMUT of the present disclosure, which showed that the displacement per input voltage of a DEB pMUT can theoretically be 400% that of a conventional unimorph pMUT.

Figure 9:
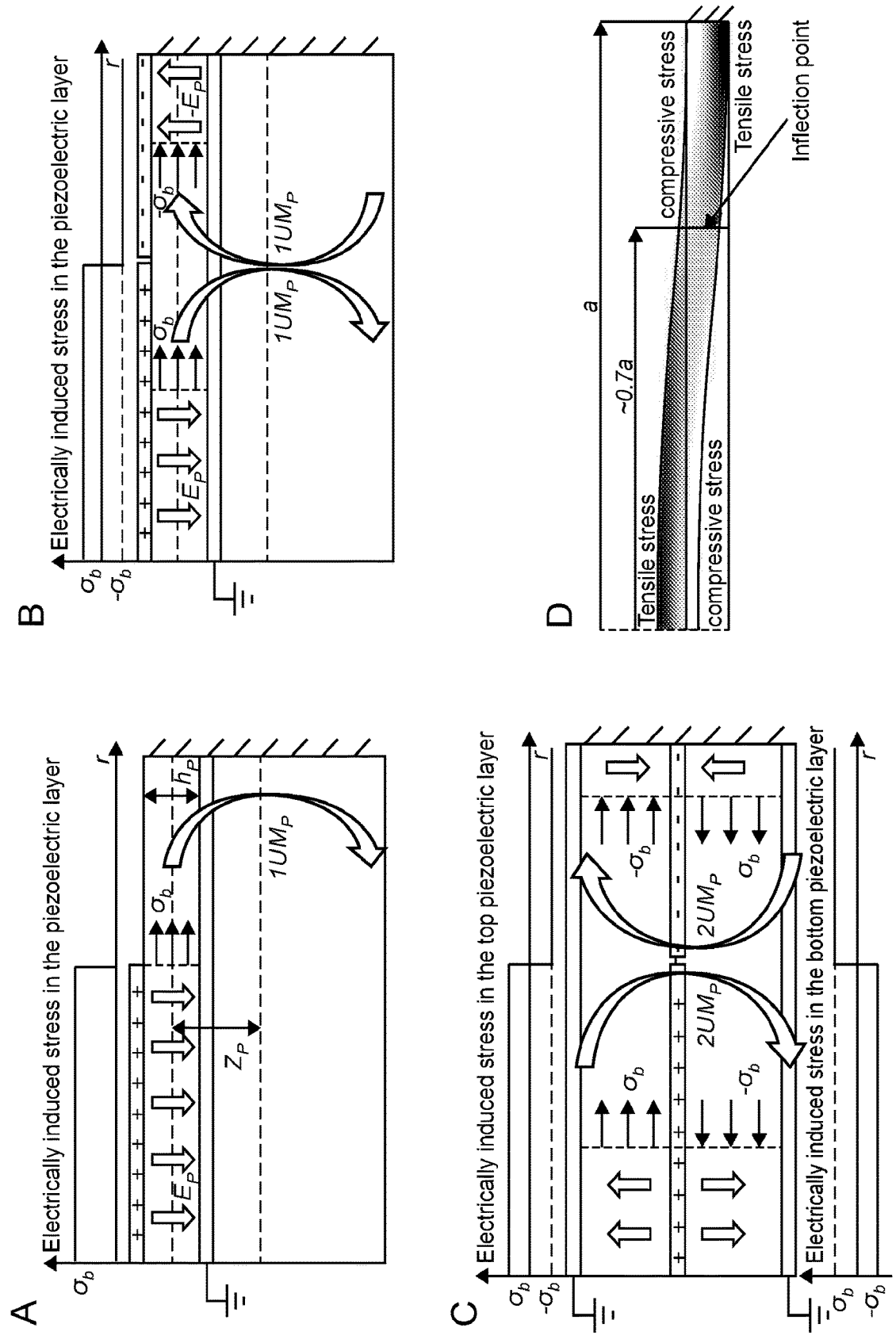
FIG. 9 shows 2D axisymmetric views of (FIG. 9, panel a) a conventional single-electrode unimorph pMUT with one active layer.

FIG. 9, panel a, shows a 2D axisymmetric view of a conventional unimorph pMUT, which includes a single active piezoelectric layer, a structural layer, a bottom electrode and a circular top electrode. By applying an electric field between the top and bottom electrodes, an in-plane electromechanical strain is induced in the portion of the piezoelectric film that is covered by the top electrode due to the $d_{31}$ effect. The stress gradient along the thickness of the diaphragm in the electrode-covered area generates a bending moment about the neutral axis of the diaphragm, which forces the diaphragm to move out-of-plane in a flexural mode. The moving device is an energy source for the medium in the transmission mode, as it transforms electrical energy to acoustic energy and radiates acoustic waves. The piezoelectrically induced moment resultant, i.e., the induced bending moment per unit transverse length for a conventional single-electrode unimorph is:

$$M_p = \sigma_p h_p Z_p \quad (1)$$

where $\sigma_p$ is the induced biaxial stress in the piezoelectric layer, $h_p$ is the piezoelectric layer thickness, and $Z_p$ is the distance from the middle of the piezoelectric layer to the neutral axis of the diaphragm. The strain-stress and the transverse piezoelectric constitutive equations are:

$$\sigma_p = [Y/(1-v)]\varepsilon_p = Y_b \varepsilon_p \quad (2)$$

$$\varepsilon_p = d_{31} E_p \quad (3)$$

where Y and v are the Young's modulus and Poisson's ratio of the piezoelectric layer, respectively, $Y_b$ is the biaxial Young's modulus ($Y_b = Y/(1-v)$) of the piezoelectric layer, $\varepsilon_p$ is the biaxial strain, and $E_p$ is the applied electric field in the piezoelectric layer. Substituting Eqs. (2) and (3) in Eq. (1) gives:

$$M_p = Y_b d_{31} Z_p V_p \quad (4)$$

where $V_p$ is the applied voltage between the two electrodes, i.e., $V_p = E_p h_p$. As expected, the induced forcing function is proportional to the applied voltage and the piezoelectric constant. In addition, the center displacement of the device in its first mode of operation is proportional to the induced moment resultant, $M_p$.

$UM_p$ is the unit of induced bending moment resultant per unit input voltage. For a conventional unimorph pMUT with certain material properties and geometry, for purpose of comparison, it can be assumed that the bending moment resultant has the value of 1 $UM_p$.

FIG. 9, panel d, shows a clamped circular diaphragm of radius a operating at its first mode. When the top inner portion (the inflection point is ~0.7 a from the center) is under tensile stress, the top outer portion is under compressive stress. If the dual-electrode unimorph pMUT (as shown in FIG. 9, panel b) is driven differentially with the same voltage magnitude but opposite polarity to the inner and outer electrodes, the top inner (outer) portion of the diaphragm will be under expansion, while the outer (inner) portion of the diaphragm will be under contraction. Thus, for a dual-electrode unimorph pMUT with the same geometry and material properties as the conventional unimorph pMUT, the overall generated moment resultant is 2 $UM_p$, and therefore, the displacement per input voltage is twice that of a single-electrode unimorph pMUT.

The bimorph pMUT with dual electrodes of the present disclosure is shown in FIG. 9, panel c. The bimorph pMUT includes two active piezoelectric layers, both of which directly contribute to the transformation of electrical energy into mechanical energy. The device has three layers of electrodes, where the top and bottom electrodes are grounded and the middle electrode includes an inner portion and an outer portion. For a DEB pMUT: a) the two active layers have similar piezoelectric polarity but the induced electric fields have opposite directions due to the electrode configuration, thus, the induced stresses have opposite signs in the piezoelectric layers at every radial position; b) As shown in FIG. 9, panel d, the in-plane stresses on the top and bottom portions at each radial position of a bending diaphragm have opposite polarities. As a result, the top and bottom active layers of a DEB pMUT with the same mechanical properties as the conventional unimorph pMUT each generate bending moment of 2 $UM_p$. As a consequence, when the middle electrodes are driven differentially, the generated moments from each portion contribute constructively to the diaphragm deformation and the overall moment resultant will be equivalent to 4 $UM_p$. As such, the DEB pMUT of the present disclosure can produce 4× the displacement sensitivity when compared with a unimorph pMUT with similar geometry and material properties.

The energy efficiency of the devices is calculated from the ratio of the output mechanical energy to input electrical energy with the following assumptions: The diaphragm area is $A_p$; the inner electrode and outer electrode areas are both equal to $0.5 A_p$ (the ring-gap area between the electrodes is negligible); the piezoelectric layer thickness and permittivity are $h_p$ and $\varepsilon_p$ respectively; the effective mechanical stiffness at the center is $k_{mc}$; and the center displacement for a single-electrode unimorph pMUT driven by $V_p$ is $x_c$. The electrical and mechanical energy equations for the single-electrode unimorph pMUT are:

$$E_{e\_SU} = \frac{1}{2}\left(\frac{0.5 A_p \varepsilon_p}{h_p}\right) V_p^2 = \frac{1}{4}\left(\frac{A_p \varepsilon_p}{h_p}\right) V_p^2 \quad (5)$$

$$E_{m\_SU} = \frac{1}{2} k_{mc} x_c^2 \quad (6)$$

thus, the electromechanical efficiency is:

$$\eta_{E\_SU} = \frac{E_{m\_SU}}{E_{e\_SU}} = 2\left(\frac{h_p k_{mc}}{A_p \varepsilon_p}\right)\left(\frac{x_c}{V_p}\right)^2 \quad (7)$$

For the dual electrode unimorph pMUT:

$$E_{e\_DU} = \frac{1}{2}\left(\frac{0.5 A_p \varepsilon_p}{h_p}\right) V_p^2 + \frac{1}{2}\left(\frac{0.5 A_p \varepsilon_p}{h_p}\right) V_p^2 = \frac{1}{2}\left(\frac{A_p \varepsilon_p}{h_p}\right) V_p^2 = 2 E_{e\_SU} \quad (8)$$

$$E_{m\_DU} = \frac{1}{2} k_{mc} (2 x_c)^2 = 2 k_{mc} x_c^2 = 4 E_{m\_SU} \quad (9)$$

$$\eta_{E\_DU} = \frac{E_{m\_DU}}{E_{e\_DU}} = 4\left(\frac{h_p k_{mc}}{A_p \varepsilon_p}\right)\left(\frac{x_c}{V_p}\right)^2 = 2\eta_{E\_SU} \quad (10)$$

Due to actuation of two electrodes, the input energy is twice as that of a single-electrode unimorph if we use the same input voltage, however, the output mechanical energy is 4× higher, therefore, the electromechanical efficiency is 2× greater. Furthermore, energy equations for the DEB pMUT are:

$$E_{e\_DB} = \quad (11)$$
$$2 \times \frac{1}{2}\left(\frac{0.5 A_p \varepsilon_p}{h_p}\right) V_p^2 + 2 \times \frac{1}{2}\left(\frac{0.5 A_p \varepsilon_p}{h_p}\right) V_p^2 = \left(\frac{A_p \varepsilon_p}{h_p}\right) V_p^2 = 4 E_{e\_SU}$$

$$E_{m\_DB} = \frac{1}{2} k_{mc} (4 x_c)^2 = 8 k_{mc} x_c^2 = 16 E_{m\_SU} \quad (12)$$

$$\eta_{E\_DB} = \frac{E_{m\_DB}}{E_{e\_DB}} = 8\left(\frac{h_p k_{mc}}{A_p \varepsilon_p}\right)\left(\frac{x_c}{V_p}\right)^2 = 4\eta_{E\_SU} \quad (13)$$

It is found from Eq. (13) that the energy efficiency of the DEB pMUT is 4× that of a single-electrode unimorph pMUT. In conclusion, both the displacement sensitivity and energy efficiency of the DEB pMUT are 400% those of a single-electrode unimorph pMUT with similar geometry and mechanical properties.

Fabrication Process

Process Flow

Figure 10:
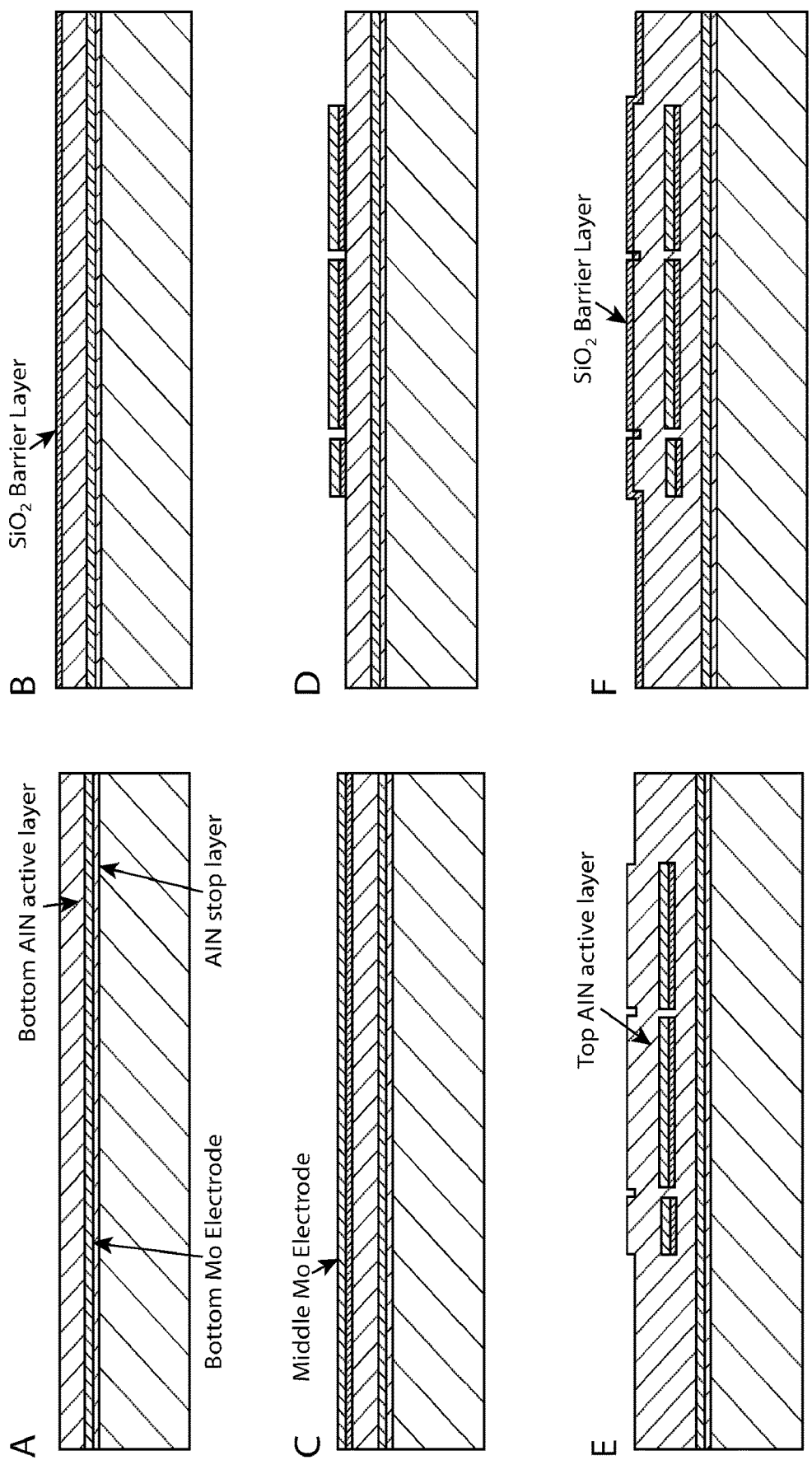
FIG. 10 shows a process flow for producing a DEB pMUT according to embodiments of the present disclosure. The process flow includes.
Figure 10:
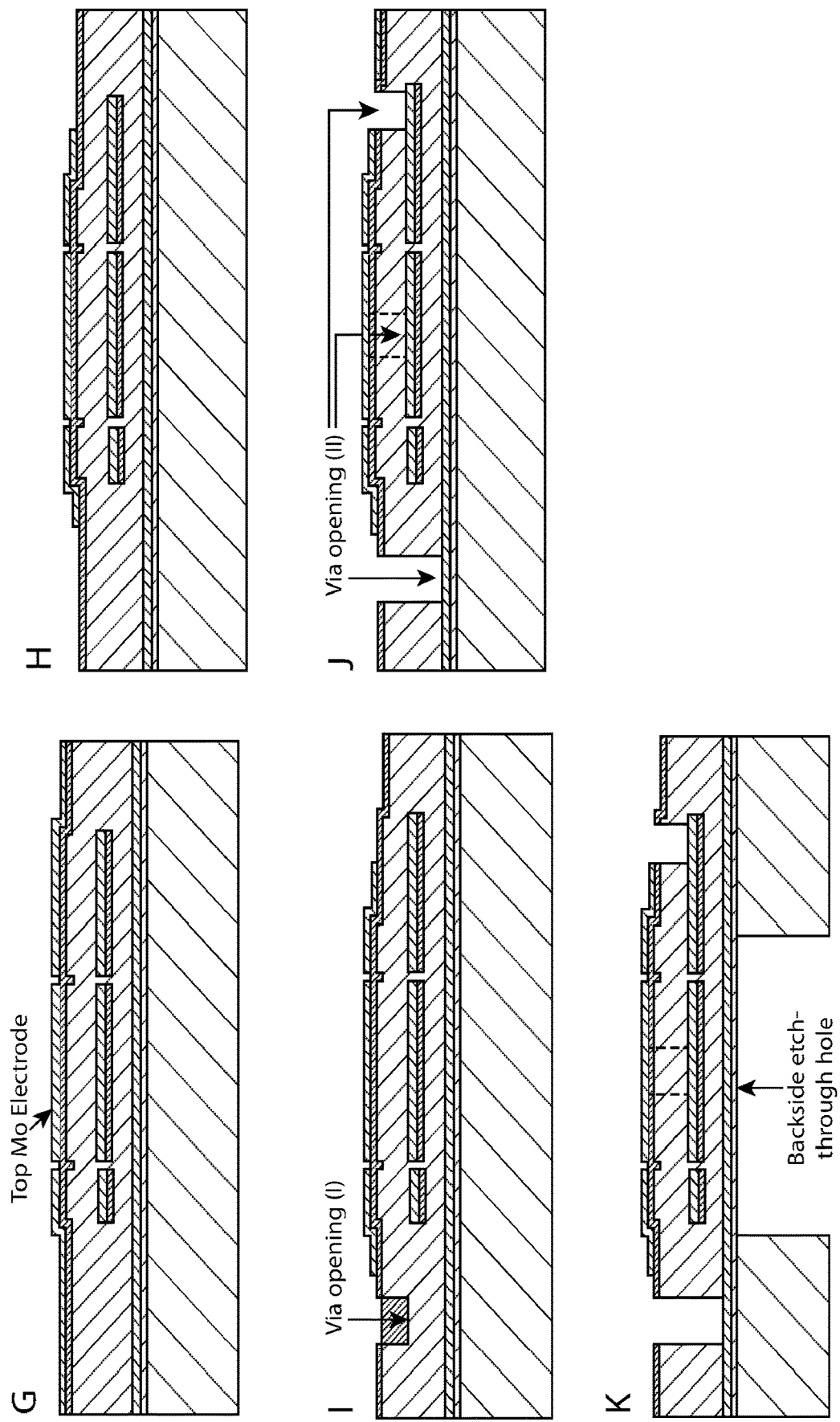

FIG. 10 shows a CMOS-compatible fabrication process flow for producing a DEB pMUT of the present disclosure. The process started with sputtering of an AlN/Mo/AlN stack with thicknesses of 210 nm, 130 nm, 715-950 nm (different AlN thickness for liquid- or air-coupled operations), respectively (FIG. 10, panel a). The first AlN layer served as the backside deep reactive ion etching (DRIE) stop layer, while the Mo layer was the bottom electrode and the second AlN layer was the bottom active layer for the DEB pMUT. FIG. 10, panel b shows the PECVD deposition of a thin (60 nm) $SiO_2$, followed by sputter deposition of the second Mo layer (130 nm) for the middle electrode (FIG. 10, panel c). The $SiO_2$ layer facilitated an increase in the breakdown voltage and device stability, and also decreased the power consumption in case of AlN crystal defects that would otherwise result in current leakage. The $SiO_2$ barrier layer prevented the diffusion of the middle Mo electrode through the bottom AlN active layer along the crystal grain boundaries during the sputtering of the second AlN active layer, which may occur due to the possible stress mismatch between the first and the second AlN active layers and thermal effects. Such diffusion may be more rapid and prominent at higher temperatures due to: a) the bottom active AlN layer expansion, so the molecular voids or the lattice defects along the grain boundaries may turn into a more susceptible diffusion path for Mo, b) diffusion pace may be naturally faster at higher temperatures. The silicon dioxide layer acted as a uniform barrier that prevented the Mo layer from diffusing through the AlN layer. Diffusion of the Mo layer may introduce two detrimental effects for the device: 1) the effective distance between the two electrodes sandwiching the AlN layer at some locations may become much smaller than the AlN thickness, thus the induced electric field in the AlN layer may become much higher than the expected value of $V_{mb}/h_{AlN1}$, where $V_{mb}$ is the applied voltage between the middle and bottom electrodes and the $h_{AlN1}$ is the first AlN active layer thickness. Such phenomenon may result in reduction of the breakdown voltage of the device; 2) The AlN resistance may be reduced, which may make it more difficult for the AlN capacitor to charge and perform electromechanical energy transformation. In addition, the device may use more current from the power source due to finite resistance of AlN, therefore, the power consumption may be increased. FIG. 10, panel d, shows patterning of the middle Mo and the silicon dioxide barrier layers using $SF_6$ and $O_2$ plasma etching. FIG. 10, panels e and f, depict the sputter deposition of the second 715-950 nm-thick AlN active layer, and the second 60 nm-thick $SiO_2$ barrier layer, which prevented the diffusion of metal via crystalline defects at the sharp edges of the patterned middle Mo or other inherent crystalline defects in the second AlN active layer and acted as a protective mask for the wet etching of AlN in the following steps.

FIG. 10, panels g and h, were the sputter deposition and patterning of the top Mo electrode layer. The dry etching in this step was time controlled so that the second $SiO_2$ barrier layer did not get etched in the field area. Afterwards, via etching to the bottom and middle Mo electrodes was conducted in a two-step process. First, via etching to the bottom electrode was performed halfway using $SF_6$—$O_2$ plasma etching for $SiO_2$ and chlorine-based reactive ion etching (RIE) for AlN (FIG. 10, panel i). The targeted etch depth was equal to the first AlN active layer thickness and was time controlled so that the remaining AlN height in the bottom and middle via became almost equal. Second, via etching to the bottom and middle electrodes were conducted simultaneously by the same chlorine-based reactive ion etching (RIE) as in the previous step (FIG. 10, panel j). The via etching ended with a final wet etching of AlN using MF-319 developer at 40° C. The Mo was highly impervious to developer etching, so there was no risk of damaging the electrodes in case of over etching. The final step was the release of the diaphragm using a through-wafer backside DRIE process (FIG. 10, panel k). AlN was an excellent stop layer for the chemistry of $SF_6$ in the DRIE process since it was highly resistant to fluorine-based plasma etching. Diffusion of the bottom Mo through the thin AlN stop layer could occur in the previous steps, which may make the AlN stop layer moderately conductive. This slightly conductive etching stop layer reduced the accumulated electric charges on the bottom diaphragm surface that would repel the incoming ions during the DRIE process, thereby reducing the undercutting phenomenon around the edges of the diaphragm.

Fabrication Results

DEB pMUTs were fabricated as described above with radii of 100-230 µm in the form of single transducers and rectilinear arrays in form of single-, five-, and ten-element (channel) devices, for both liquid-coupled and air-coupled applications. An array included multiple elements (also referred to as "channels") that can be driven separately, with multiple pMUTs in each element.

Figure 11:
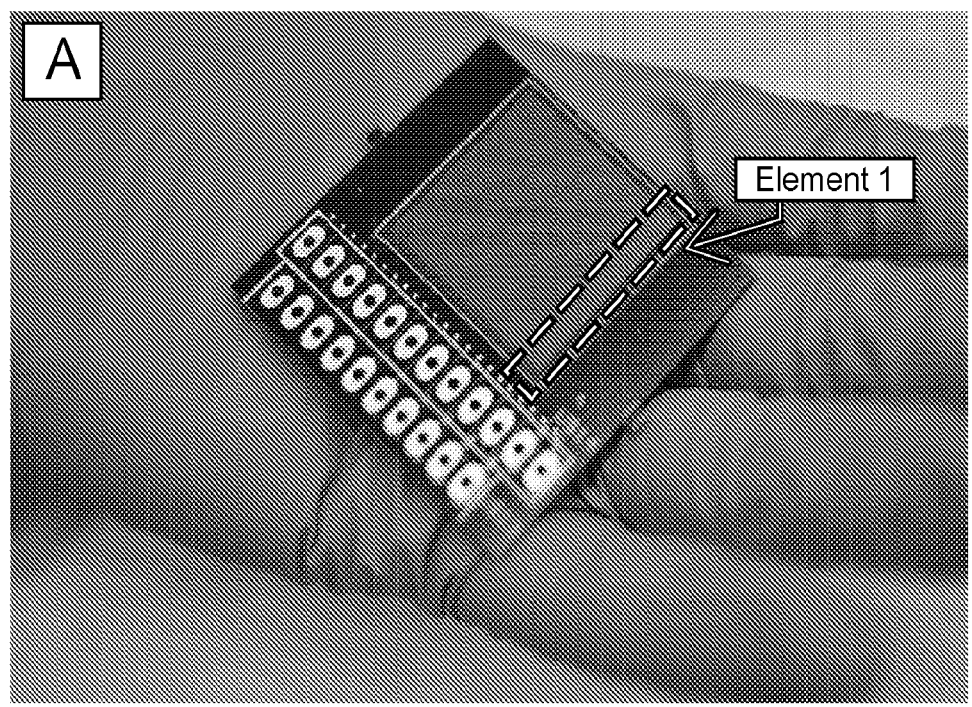
Figure 11:
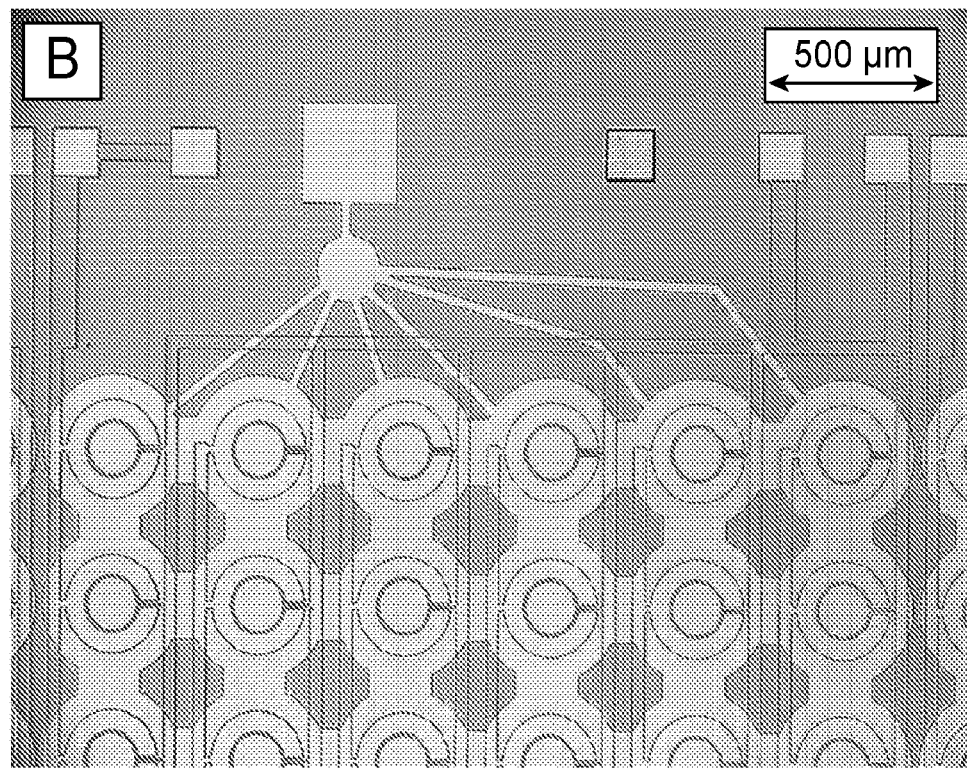

FIG. 11, panel a, shows a diced, 10-element, planar array of DEB pMUTs attached and wire bonded to a PCB. Each element in the 10-element array included an array of 6×60 DEB pMUTs and the pMUTs had radii of 115 µm. FIG. 11, panel b shows a close-up top-view microscopic image of a portion of an element of FIG. 11, panel a, close to the bond-pads and connection areas. The top electrode and the vias to the middle and the bottom electrodes can be seen in FIG. 11, panel b. In addition, the patterned middle electrodes were visible because their edge pattern was transferred to the top layers.

Figure 12:
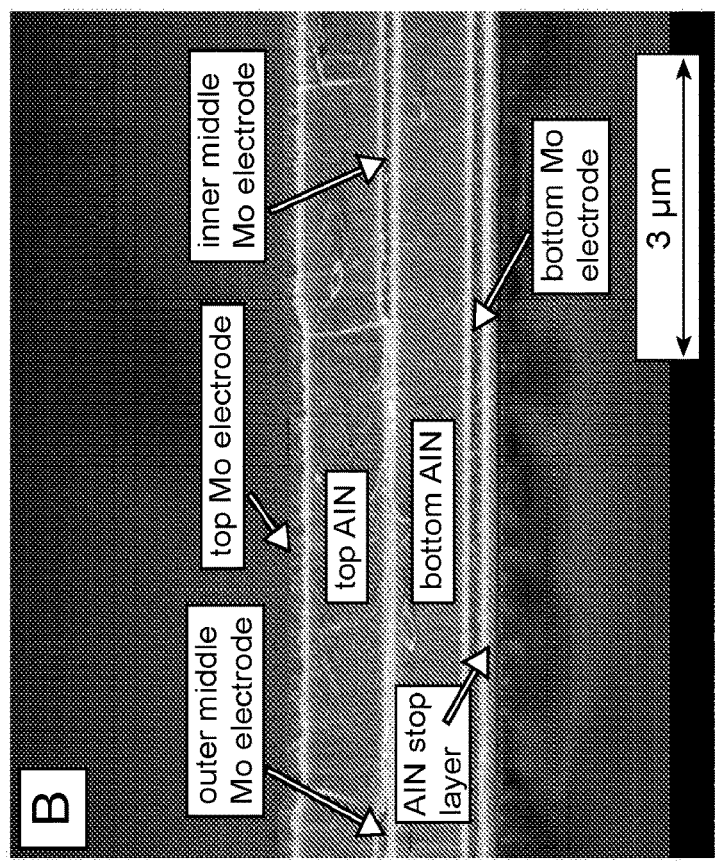
FIG. 12, panel a, shows a side-view SEM image of a DEB pMUT, cleaved after the backside DRIE process, according to embodiments of the present disclosure.
Figure 12:
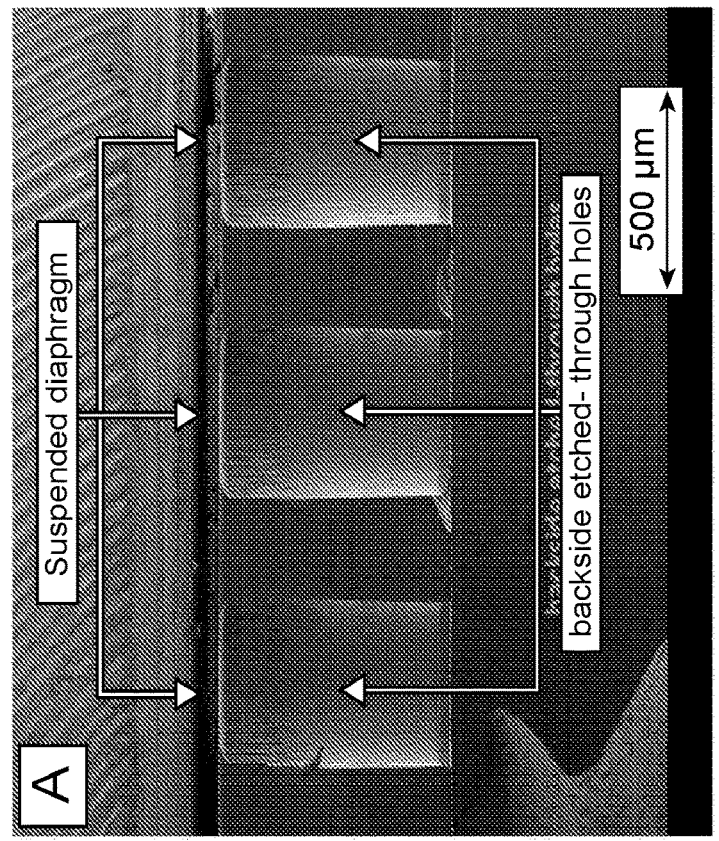
Figure 12:
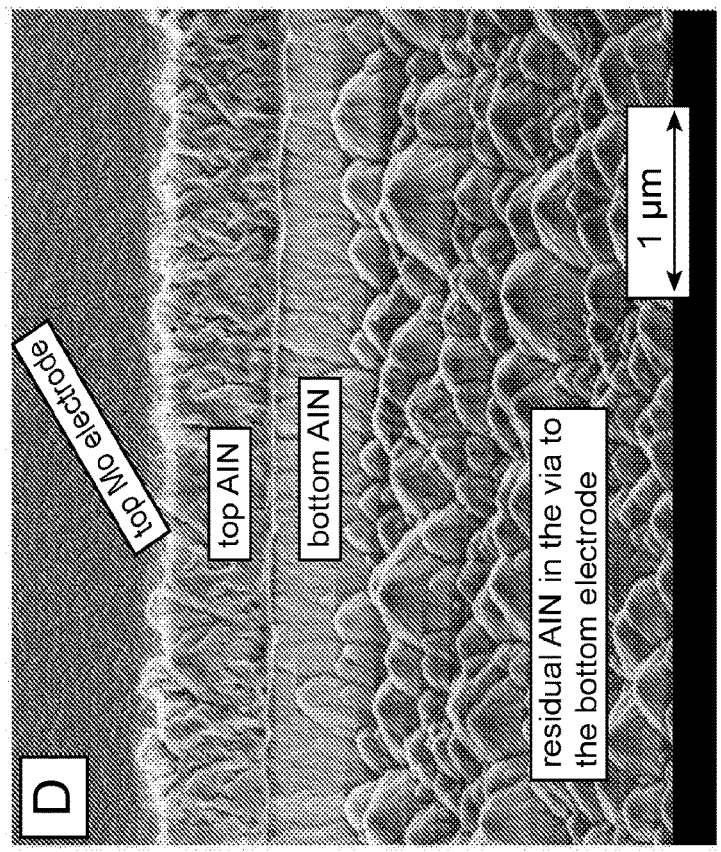
Figure 12:
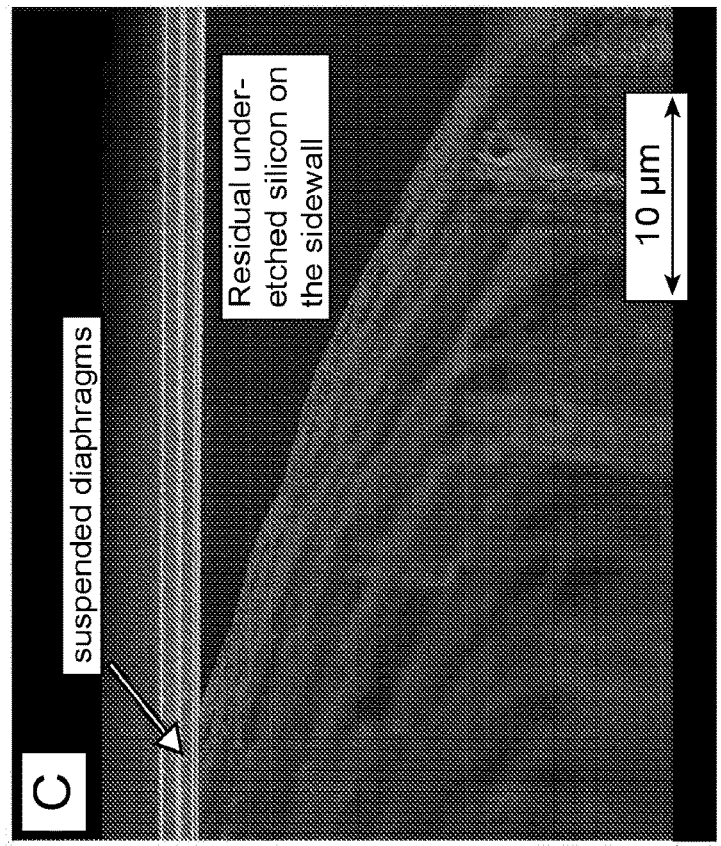

FIG. 12, panel a, is a cross-sectional SEM micrograph of an array of cleaved DEB pMUTs showing the suspended diaphragms, as well as the backside etch-through holes made by DRIE. FIG. 12, panel b, is a close-up view of a cleaved DEB diaphragm near the separation between the inner and outer middle electrodes showing the AlN and Mo layers. As shown in FIG. 12, panel b, the AlN crystal grains were vertically oriented, which facilitated good piezoelectricity in the AlN layer. FIG. 12, panel c, is an SEM image of a suspended diaphragm near its clamped edge, showing the residual silicon (dark region) on the diaphragm backside close to the sidewall due to under-etching of silicon in the DRIE process. FIG. 12, panel d, is a close-up SEM micrograph of a bottom-electrode via structure before the AlN wet etching has been completed, as evidenced by the residual AlN grains on top of the bottom electrode.

Figure 13:
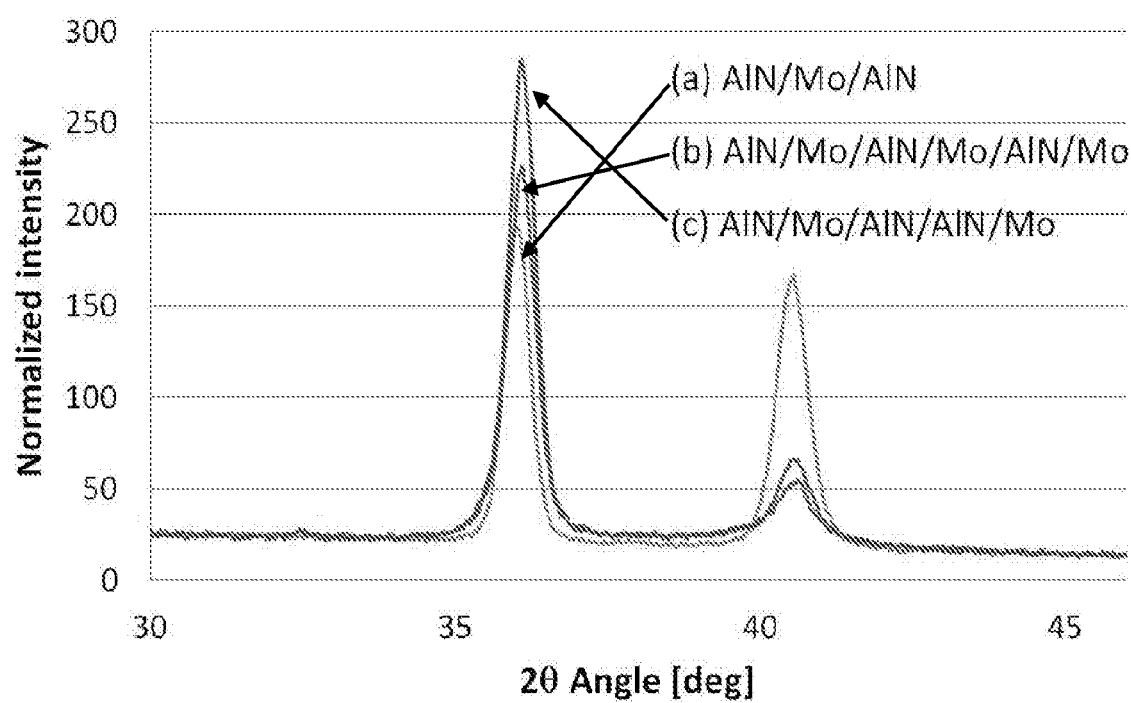
FIG. 13 shows a graph of XRD measurements of a DEB pMUT wafer on the AlN layers showing good crystallinity of the AlN layers, according to embodiments of the present disclosure.

In order to investigate the crystalline quality of the deposited AlN layers, X-ray diffractometer (XRD) measurements were conducted as shown in FIG. 13. The first AlN layer was directly measured after its sputtering. However, after the deposition of the second AlN layer, the XRD data only exhibits combined information regarding the overall quality of the first and the second AlN layers and does not reveal explicit data about the second layer. By comparing the data after different steps and from different locations, corresponding to three different film stacks of (a) AlN/Mo/AlN, (b) AlN/Mo/AlN/Mo/AlN/Mo, and (c) AlN/Mo/AlN/AlN/Mo, it was found that stack (b) in the (002) crystalline direction had higher amplitude and slightly narrower FWHM as compared to those of stack (a), indicating good quality of both the first and the second AlN layers. The FWHM had the measured value about 1.7°-1.8° from the Rocking Curve and was another indication of good quality of AlN layers. The difference between the angle values at the intensity peaks among the stacks was due to the stage calibration error.

Displacement Measurements Results

A. Displacement Sensitivity of a Single DEB pMUT

Figure 14:
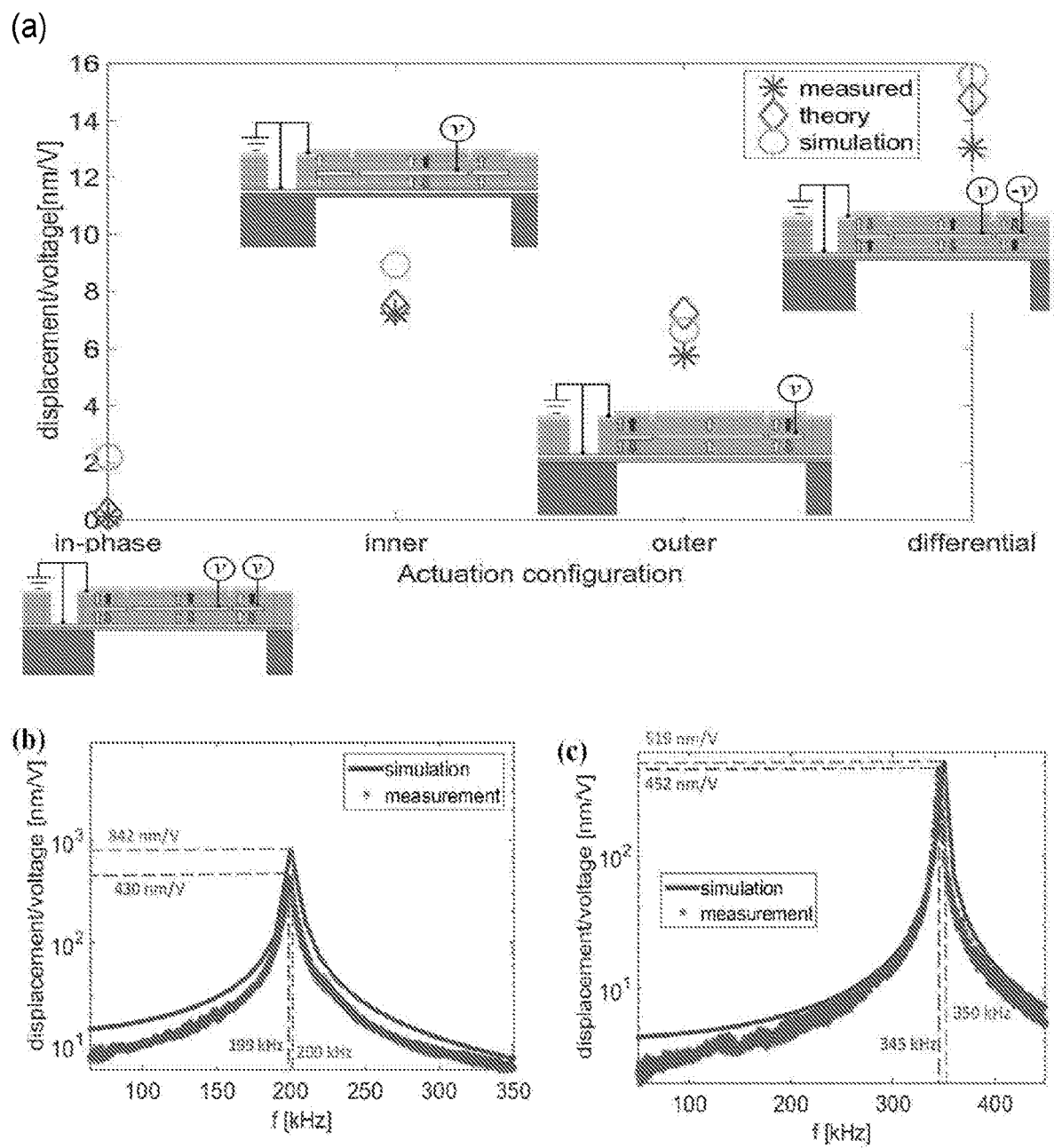
FIG. 14, panel a, shows a graph of low frequency center displacement/voltage results under different driving configurations from an air-coupled DEB pMUT according to embodiments of the present disclosure.

In order to evaluate the operation of DEB pMUT under different driving configurations, low frequency center displacement sensitivity of an air-coupled pMUT was measured using a Laser Doppler Vibrometer (LDV). Low frequency displacement was equal to the product of fractional bandwidth and the resonant displacement, both of which should be as high as possible to maximize the performance of the pMUT. FIG. 14, panel a, shows the low frequency center displacement sensitivity of a DEB pMUT with radius of 230 µm, total stack thickness of 2.4 µm, and the inner circular electrode radius of 70% of the diaphragm radius. When the inner electrode was driven while the outer electrode was grounded, the low frequency displacement was theoretically predicted as 7.50 nm/V, simulated by finite element analysis as 8.91 nm/V, and experimentally measured as 7.26 nm/V. When the outer electrode was driven with a grounded inner electrode, the low frequency displacement was theoretically predicted as 7.27 nm/V, simulated as 6.65 nm/V, and experimentally measured as 5.75 nm/V. If the areas of the inner and outer electrode are equal, the theoretical actuation displacement by the individual inner and outer electrode should be equal. The discrepancy in the calculated and measured values may be due to backside etching defects especially on the edges of the diaphragm, such as: over/under etching, residual silicon grass on the backside, and other fabrication uncertainties which may change the effective shape, size, and mass distribution of the transducers. Under the differential drive, the measured low frequency displacement was 13.01 nm/V, only about 11.9% and 16% lower than the theoretical and simulated values of 14.76 nm/V and 15.54 nm/V, respectively. The differential drive mode produced 1.96× displacement sensitivity, which was very close to the 2× increase predicted by the analysis discussed above. The in-phase actuation resulted in negligible low frequency displacements as shown.

The center displacement frequency responses of two DEB pMUTs with radii of 230 µm and 170 µm have been characterized using LDV as shown in FIG. 14, panels b and c, respectively. The frequency response matched well with the simulated data for both cases. The slight reductions in the displacement per input voltage values in experiments comparing to the simulation results were likely due to the residual stress in the structural layers (such as in the metal layers) and possible defects in the AlN crystalline structures with reduced piezoelectricity. Nevertheless, the value of 452 nm/V at the center resonant frequency of 345 kHz was 4.3× and 2.4× higher than those from a conventional single-electrode (at 104 nm/V) and dual-electrode (at 188 nm/V) unimorph pMUT at a resonant frequency of 291 kHz. As a result, the DEB pMUT generated higher acoustic pressure (which was proportional to volumetric displacement-frequency product, i.e., volumetric velocity). Another cause of bimorph pMUT exhibiting improved performance that also agreed more accurately with simulation results compared to reported unimorph pMUTs was that the sputtering of the films was performed separately, thus, there was more margin for stress tuning at each step to achieve low stress in each layer in addition to tuning the average stress in the whole stack.

B. Displacement Sensitivity of a Single-Element DEB pMUT Array

Figure 15:
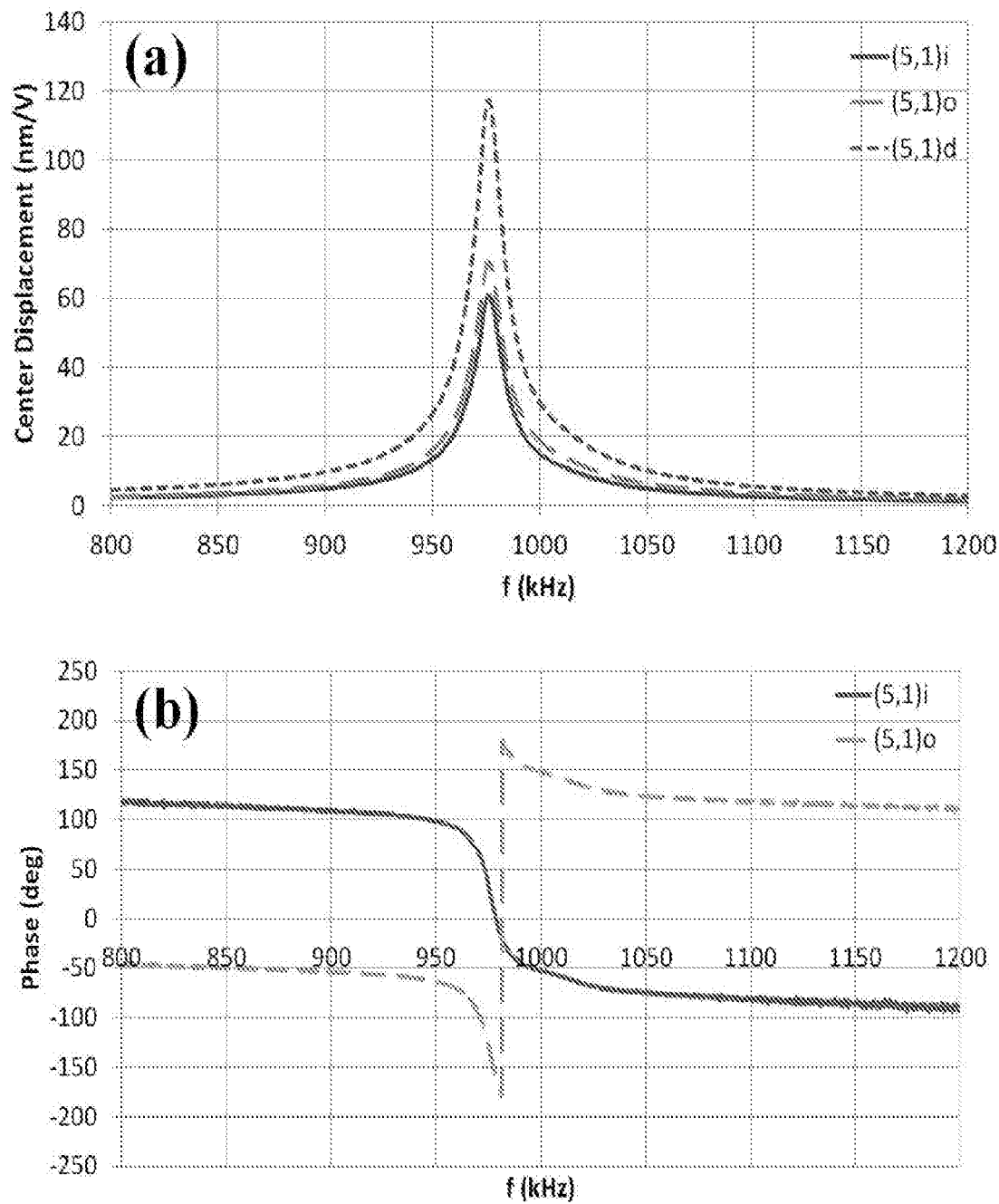
FIG. 15 shows graphs of measured center displacement sensitivity magnitude (FIG. 15, panel a) and phase (FIG. 15, panel b) versus frequency of DEB pMUT (5,1) of a single-element array of 27×6 pMUTs, measured using LDV under inner electrode (i), outer electrode (o) and differential drive (d) actuation schemes, according to embodiments of the present disclosure. The displacement responses under the inner and outer electrode actuation schemes had nearly the same magnitude with opposite polarities.
Figure 15:
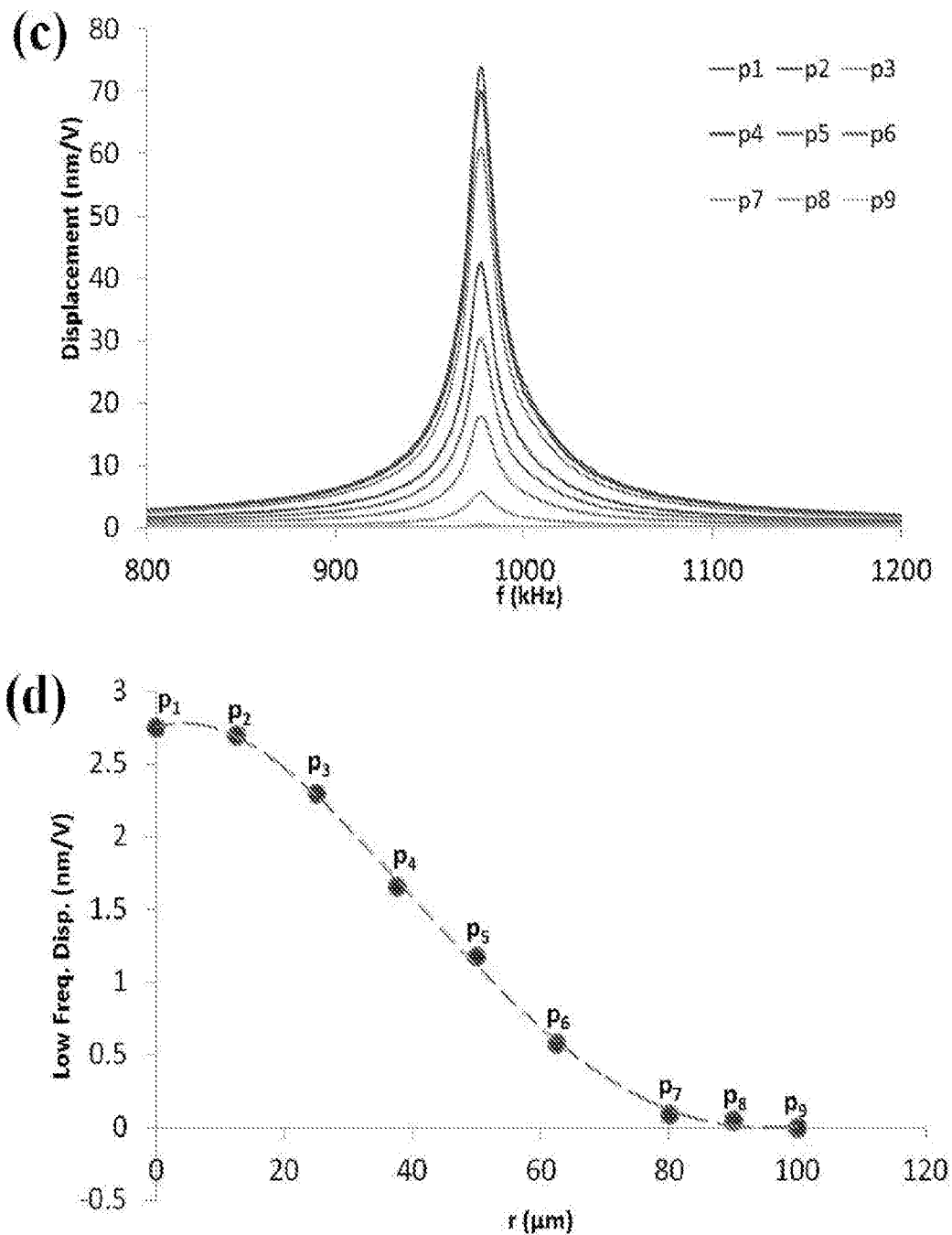

Displacement sensitivity measurements were conducted for individual transducers in an array structure. FIG. 15, panels a and b, show the measured magnitude and phase of the center displacement with respect to frequency for a DEB pMUT located in row 5 and column 1 (5,1) of a 27×6 single-element array of DEB pMUT with a diaphragm diameter of 100 µm and total stack (AlN/Mo/AlN/Mo/AlN/Mo) thickness of 2150 nm. The solid lines show the response under the actuation of the inner circular electrode and the dashed lines were the responses under the actuation of the outer annular electrode. The dotted line in FIG. 15, panel a, shows the response under the differential drive. The center displacement magnitudes had similar trend and value in both driving methods with 15.4% and 16.5% difference between their values at low frequency and resonance, respectively (FIG. 15, panel a). As discussed previously, the magnitude responses under the actuation of inner and outer electrode should be similar if the electrode areas are equal to half of the whole diaphragm area, but the difference here may likely be due to the difference between the effective electrode areas as a result of various fabrication uncertainties, such as the outer electrode area change from the designed dimensions due to under/over backside etching and the non-symmetric shape of the annular electrode due to the inner electrode connection path passage gap. The center displacement magnitude under differential drive was measured to be 1.92× and 1.66× the center displacement magnitude under inner and outer electrode drive, respectively. The deviation from the ideal case (expected 100% higher displacement in differential drive mode as opposed to 92% and 66%), may be due to the inequality of the electrode sizes after fabrication and the parasitic input electrical impedances of the inner and outer electrodes, which can cause the induced displacements from either port not to be completely in phase with the other. As shown in FIG. 15, panel b, the measured displacement phases from inner and outer electrode actuation had almost opposite polarities (177° phase offset on average) because inner- and outer-electrode drive induced motion in opposite directions. In other words, if the input harmonic voltage V on the inner electrode bent the diaphragm downward at time τ after the initial excitation, the same voltage on the outer electrode will bend the diaphragm upward (the opposite direction of motion) at time τ after the initial excitation, with the same displacement magnitude. Hence, if both of the inner and outer electrodes were driven with the same voltages simultaneously in phase, the diaphragm will have nearly zero flexural motion, while the differential drive mechanism produced two times higher amplitude as compared with results from the single-electrode drive. The reason why the phase offset was not exactly 180° may be attributed to the parasitic impedances of the inner and the outer channels.

FIG. 15, panels c and d, show the radial LDV scan results of pMUT (1,1) of a single-element DEB pMUT array with 27×6 pMUTs where the outer electrode was driven by an AC voltage. FIG. 15, panel c, shows the frequency response of various points along the radius of DEB pMUT (1,1) where p1 was the center point, $p_9$ was a point on the rim anchor of the pMUT, and the rest of the points were placed between these two points. As the points were further away from the center location, the displacement amplitude became smaller until reaching zero at the clamped edge as predicted from the first mode of oscillation. FIG. 15, panel d, shows the measured low frequency displacement sensitivity for points $p_1$ to $p_9$, indicating that the mode shape of the device followed the equation $$\frac{w}{w_{max}} = \left(1 - 1.25\left(\frac{r}{a}\right)^2\right)^2$$

with 0.99 R-Square value, where w is the normal displacement, r is the radial distance from the center, and a is the radius of the diaphragm. The fitted equation matched well to the equation $$\frac{w}{w_{max}} = \left(1 - \left(\frac{r}{a}\right)^2\right)^2$$

which was typically used to approximate the first mode shape of a clamped circular diaphragm. The coefficient 1.25 in the fitted curve can be attributed to geometric imperfection due to backside under-etching creating an effective radius of (4/5) a during the backside DRIE process.

Figure 16:
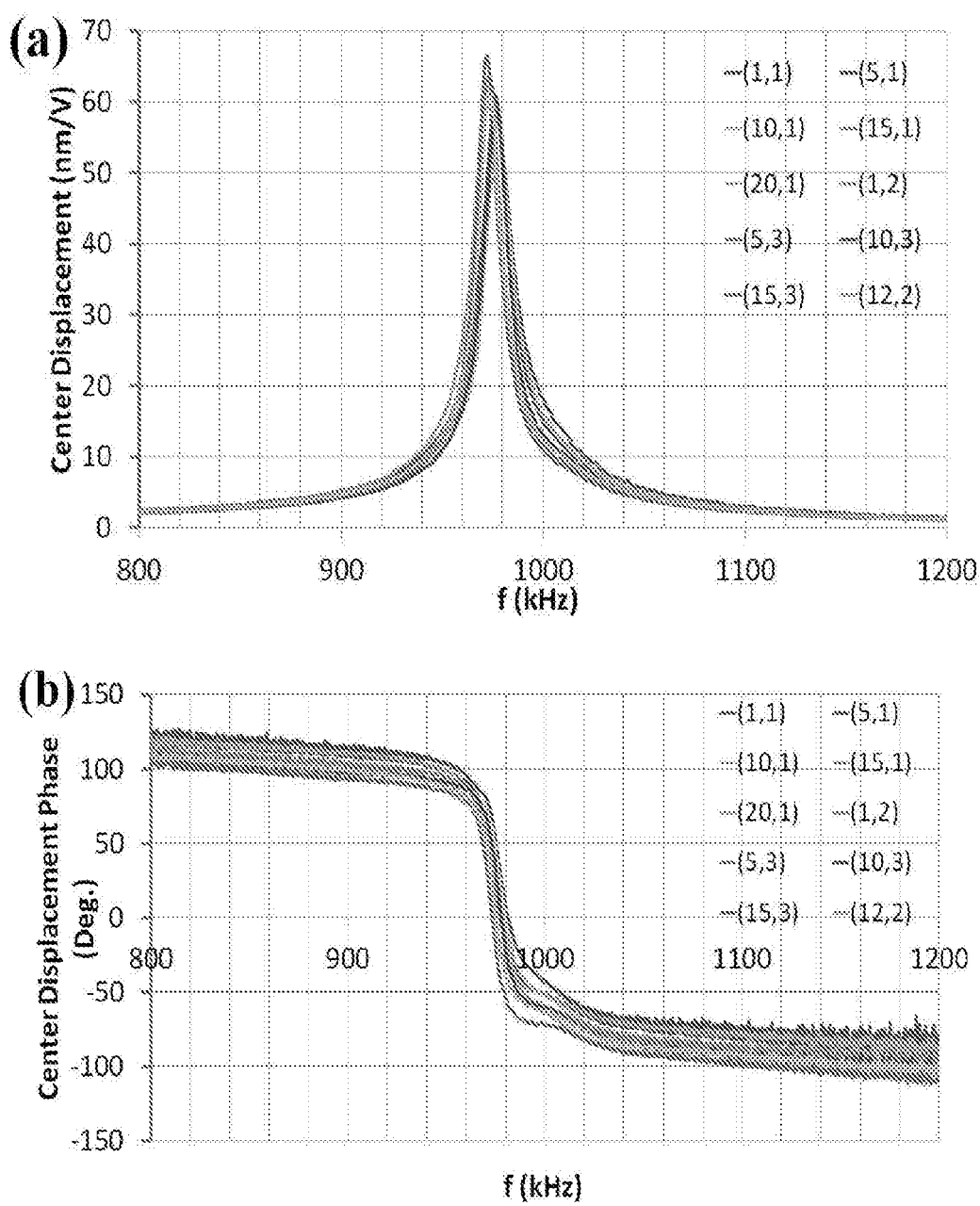
FIG. 16 shows graphs of center displacement magnitude (FIG. 16, panel a) and phase (FIG. 16, panel b) with respect to frequency of various DEB pMUT of a single-channel array from a 27×6 DEB pMUT array structure, measured using LDV under the inner electrode actuation scheme, according to embodiments of the present disclosure. The frequency response between the pMUTs from different locations of the array showed very good consistency in terms of the resonant frequency, displacement magnitude, and phase angle.

Experiments were also conducted to record the center displacement sensitivity versus frequency for various DEB pMUT in the single-element array (same as those in FIG. 15, panel a) driven simultaneously via the inner electrodes and grounded outer electrodes. FIG. 16, panel a, shows results of ten transducers with an average center frequency of 974.85 kHz and a standard deviation of 2.46 kHz. The average resonant displacement was 59.8 nm/V with a standard deviation of 4.5 nm/V, while the average low frequency displacement was 2.7 nm/V with a standard deviation of 0.7 nm/V. These results showed very good consistency between the frequency responses of different transducers with only very small variations across the array. FIG. 16, panel b, shows that the phase angle responses of the same transducers in FIG. 16, panel a, were very close to each other and had similar phase shift frequencies. As pMUTs were located further away from the bond pad with longer metal connecting path in between, their phase angles became smaller, i.e., shifted toward negative. This was due to the larger stray capacitance caused by longer metal connector lengths from the bond pads to the pMUTs. To avoid this, connector areas can be designed to be equal by varying the connector width to compensate for the conductor length variations.

Acoustic Response

A. Low-Voltage Measurements in Air and Water

Figure 17:
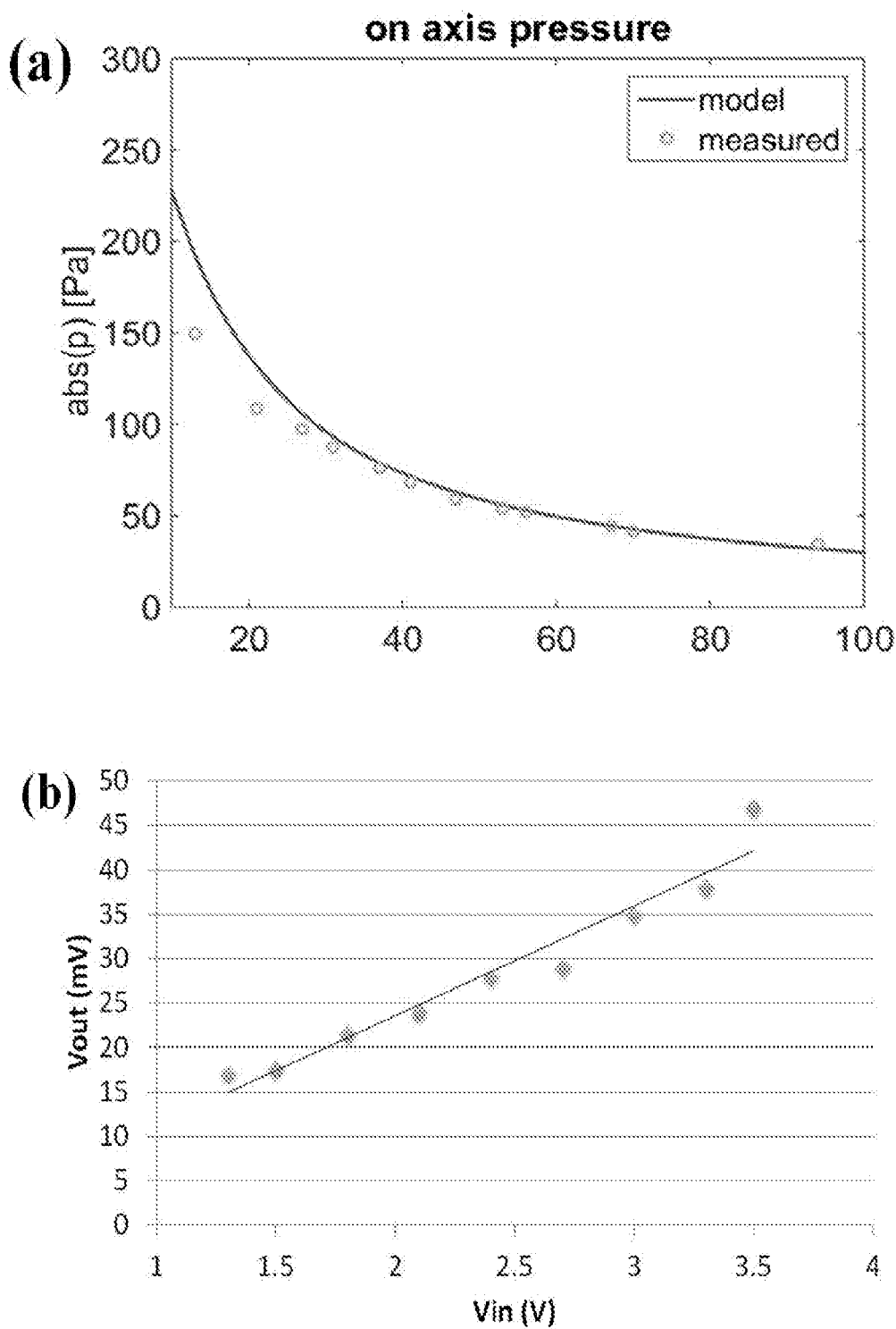
FIG. 17, panel a, shows a graph of measured axial pressure of a single-channel DEB pMUT array of 6×27 pMUTs driven with 0.5 Vpp at 250 kHz in water, according to embodiments of the present disclosure.
Figure 17:
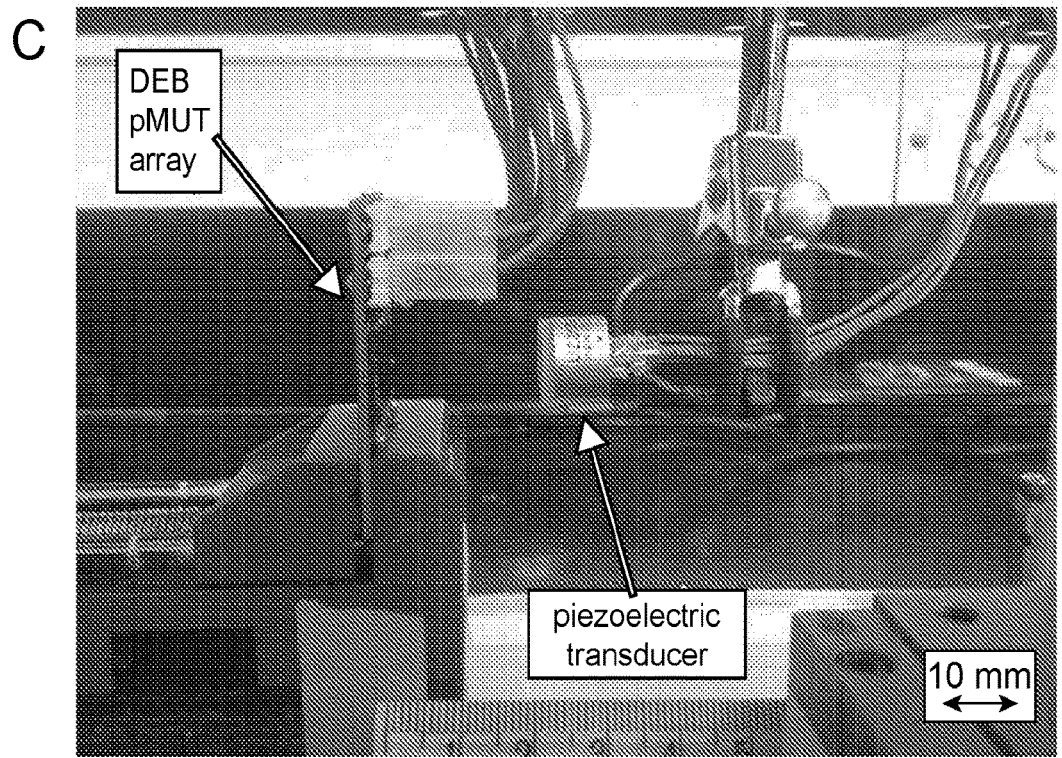
Figure 17:
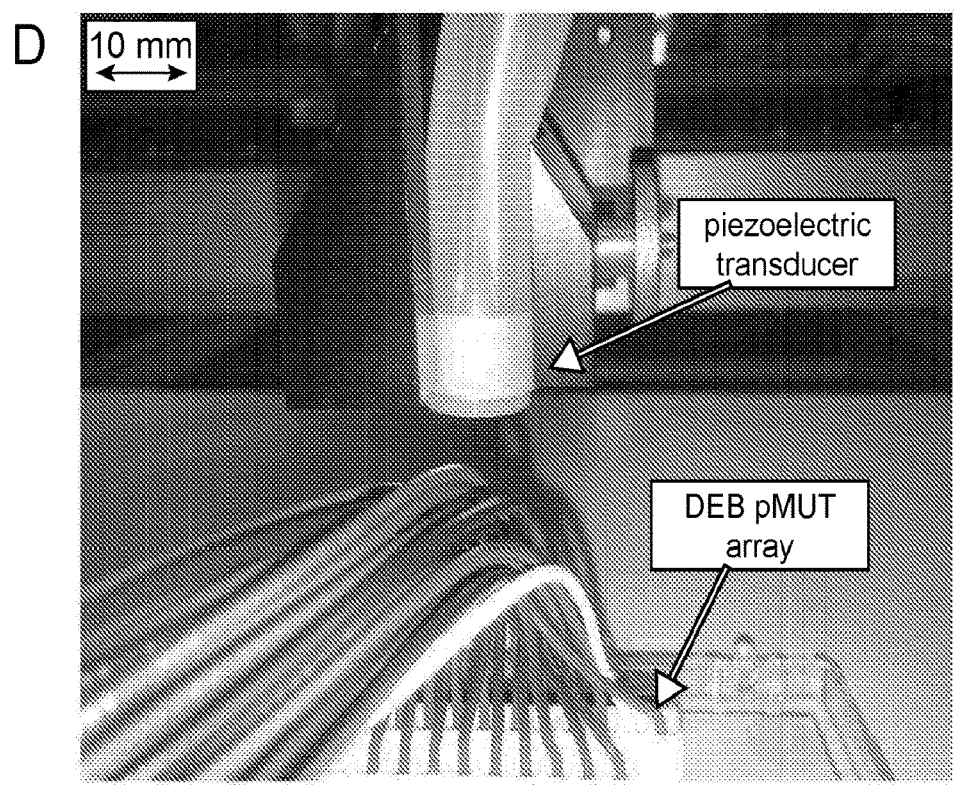

The acoustic response of a single-channel 27×6 DEB pMUT array was measured using a piezoelectric transducer (UZ250, Noliac) both in air and water. FIG. 17, panel a, shows the axial pressure generated by the aforementioned array driven by 0.5 $V_{pp}$ at 250 kHz in DI water as a function of the vertical distance under the inner-electrode driving scheme. The measured data was consistent with the theoretical model for pMUT arrays. Data points measured at further distance were in better agreement with the theoretical model since the correct alignment between the pMUT array and the piezoelectric transducer became difficult as the pMUT array and piezoelectric transducer get closer to one another. Furthermore, approximations have been used in the theoretical model for the near-field region, which introduce additional estimation errors. FIG. 17, panel b, shows the received voltage amplitude by the piezoelectric transducer ($V_{out}$) as a function of the array driving voltage amplitude ($V_{in}$) at 250 kHz frequency in air. The distance between the array and the piezoelectric transducer was set to be 27 mm and the input voltage range was from 1.3 $V_{pp}$ to 3.5 $V_{pp}$, which was suitable for battery powered handheld devices. The DEB pMUT array showed good linearity in the input voltage range of interest for such devices. FIG. 17, panels c and d, show the measurement setups in water and air, respectively.

B. Intensity Assessment for Therapeutic Ultrasound

Figure 18:
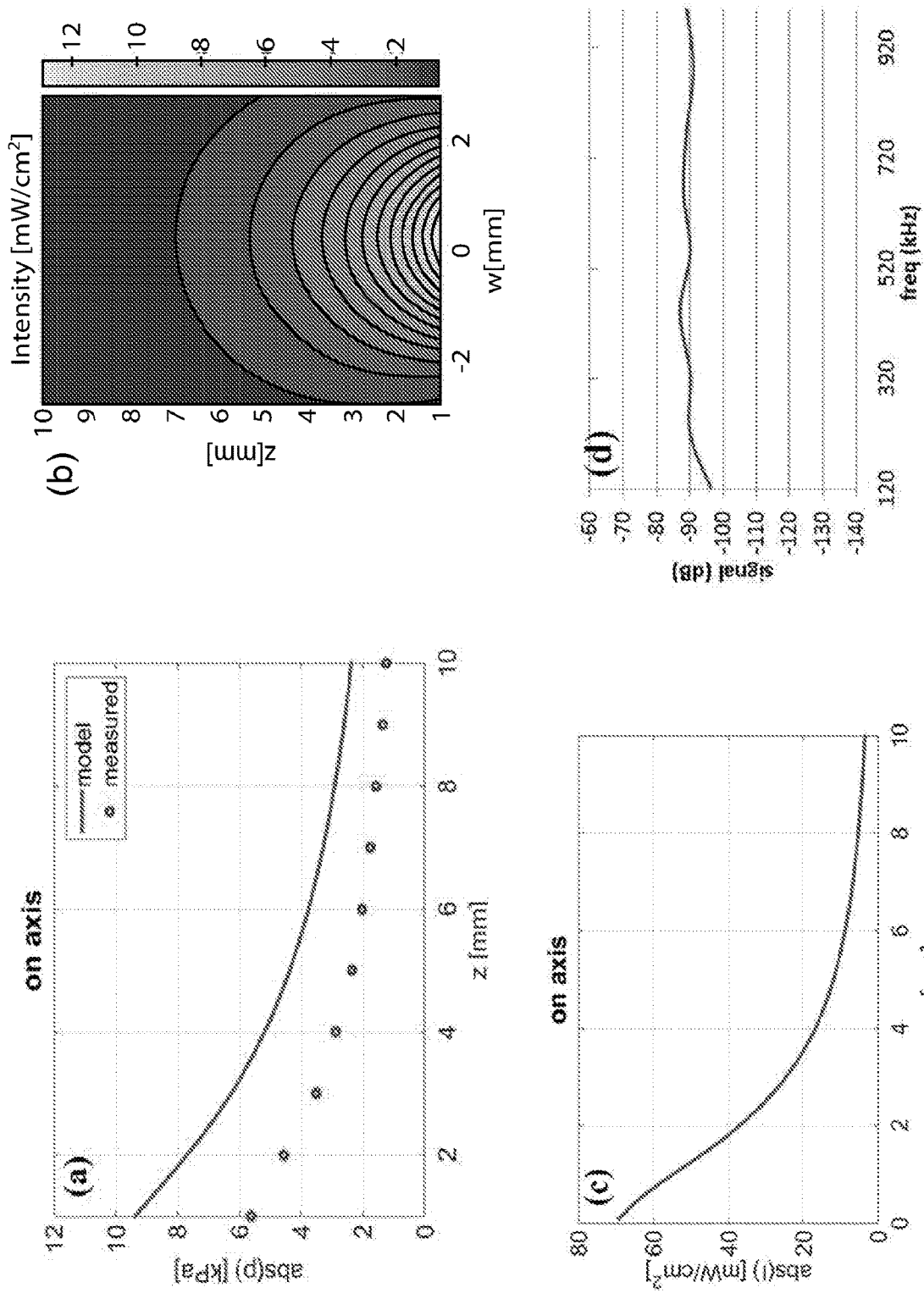
FIG. 18, panel a, shows a graph of measured and simulated axial pressure versus vertical distance, and FIG. 18, panel b, shows a 2D plot of the modeled intensity of the 12×12 array in oil tank driven under 2.5V AC differentially, according to embodiments of the present disclosure.

Medical studies have shown that low-intensity pulsed ultrasound (LIPUS), with low acoustic intensities of less than 0.1 $W/cm^2$ (typically 30 $mW/cm^2$) can significantly increase cell differentiation and accelerate fracture healing. For the purpose of implementation of the transducers in battery-powered handheld devices for therapeutic medical applications, the device can be capable of generating high enough acoustic intensity in the region of interest at low voltages. A single-channel 12×12 array of DEB pMUT with a total area of 7 mm×7 mm was fabricated. Acoustic testing was conducted in mineral oil with density of 0.8493 $g/cm^3$ and sound speed of 1440 m/s. The array was driven differentially with +/−2.5 $V_{ac}$ on the inner and outer electrodes, respectively. FIG. 18, panel a, shows a graph indicating similar trends and reasonable agreement between the simulated and the measured axial pressure using a needle hydrophone (Y-120, Sonic Concepts, Inc.), and FIG. 18, pane b, is the simulated intensity field of the array under the same driving scheme. The discrepancy between simulation and experimental results may be due to the negligence of the mutual coupling effects of the pMUTs in the simulation as well as fabrication uncertainties which were not incorporated in the model. The axial intensity of the array when driven differentially with +/−5 $V_{ac}$ is shown in FIG. 18, panel c, demonstrating that the array was capable of generating high enough acoustic intensity in the range of 30-70 $mW/cm^2$ up to 2.5 mm deep using voltages that were sufficiently low to be used in battery-powered handheld devices for therapeutic applications. The fabricated array was measured to have a significantly higher normalized acoustic intensity of 27 $\mu W/(\mu m^4)$ (at 1.5 mm away), as defined as $I_n = I/(VNd_{31})^2$, as compared to conventional pMUT arrays. Here, I is the acoustic intensity, V is the input voltage amplitude, N is the total number of pMUTs, and $d_{31}$ is the piezoelectric charge constant. Since intensity is proportional to pressure squared, pressure is proportional to the effective volumetric velocity, and the effective volumetric velocity is proportional to $VNd_{31}$, such definition of normalized intensity is introduced so that pMUT arrays of different piezoelectric properties, driving voltages, and number of transducers can be compared only based on the individual pMUT design. FIG. 18, panel d, shows a graph of the measured pressure frequency response of a 6×60 DEB pMUT array in water showing extremely large bandwidth of the array. Large bandwidth is useful for medical applications that require various transmission operation frequencies or when the transmission and receiving frequencies of interest are far apart, such as harmonic imaging. The achieved large bandwidth here was due to the large size of the array formed of multiple pMUTs all driven simultaneously and can generate multiple resonant frequencies close to one another.

Conclusion

Single-transducers, as well as various arrays of DEB pMUT for both air- and liquid-coupled applications, were produced and tested. Both analytical simulations and experimental measurements showed that the energy efficiency and displacement sensitivity of the DEB pMUT transducer was up to 4× those of conventional single-electrode unimorph pMUT. Fabrication techniques were utilized for the development of the DEB pMUT devices with excellent crystal quality of AlN layers and good manufacturing yield. Experimental results matched well with analytical and simulation results. Furthermore, a liquid-coupled DEB pMUT array produced the highest normalized acoustic intensity, $I_n = I/(VNd_{31})^2$, and the measurement results showed that the devices can be used in low-voltage handheld medical ultrasonic devices.

Table of the Material Properties Used in the Analysis and Simulations

| Parameter | Description | Value | Unit |
|---|---|---|---|
| $\rho_{AlN}$ | AlN density | 3300 | Kg/m$^3$ |
| $Y_{0\text{-}AlN}$ | AlN Young's modulus | 348 | GPa |
| $V_{AlN}$ | AlN Poisson's ratio | 0.30 | — |
| $d_{31\text{-}AlN}$ | AlN Piezoelectric charge constant | 2.20 | pm/V |
| $\varepsilon_{AlN}$ | AlN Dielectric constant | 10.26 | — |
| $\rho_{Mo}$ | Mo density | 10220 | Kg/m$^3$ |
| $Y_{0\text{-}Mo}$ | Mo Young's modulus | 329 | GPa |
| $V_{Si}$ | Poly-Si Poisson's ratio | 0.32 | — |

It is to be understood that embodiments of the present disclosure are not limited to particular aspects or aspects described, as such may vary. It is also to be understood that the terminology used herein is for the purpose of describing particular aspects only, and is not intended to be limiting, since the scope of the embodiments of the present disclosure will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within embodiments of the present disclosure. The upper and lower limits of these smaller ranges may independently be included in the smaller ranges and are also encompassed within embodiments of the present disclosure, subject to any specifically excluded limit in the stated range. Where the stated range includes one or both of the limits, ranges excluding either or both of those included limits are also included in embodiments of the present disclosure.

Unless defined otherwise, all technical and scientific terms used herein have the same meaning as commonly understood by one of ordinary skill in the art to which embodiments of the present disclosure belong. Although any methods and materials similar or equivalent to those described herein can also be used in the practice or testing of embodiments of the present disclosure, representative illustrative methods and materials are described herein.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that embodiments of the present disclosure are not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

It will be appreciated that as used herein, the term "dissolve" may be used to indicate melt, soften, liquefy, thaw, disrupt, break up, break open, break apart, or otherwise destroy a layer or coating of material encapsulating an ingestible event marker either wholly or partially to release the ingestible event marker.

As will be apparent to those of skill in the art upon reading this disclosure, each of the individual aspects described and illustrated herein has discrete components and features which may be readily separated from or combined with the features of any of the other several aspects without departing from the scope or spirit of embodiments of the present disclosure. Any recited method can be carried out in the order of events recited or in any other order which is logically possible.

Although the foregoing embodiments of the present disclosure have been described in some detail by way of illustration and example for purposes of clarity of understanding, it is readily apparent to those of ordinary skill in the art in light of the teachings of the present disclosure that certain changes and modifications may be made thereto without departing from the spirit or scope of the appended claims.

Accordingly, the preceding merely illustrates the principles of embodiments of the present disclosure. It will be appreciated that those skilled in the art will be able to devise various arrangements which, although not explicitly described or shown herein, embody the principles of embodiments of the present disclosure and are included within its spirit and scope. Furthermore, all examples and conditional language recited herein are principally intended to aid the reader in understanding the principles of embodiments of the present disclosure and the concepts contributed by the inventors to furthering the art, and are to be construed as being without limitation to such specifically recited examples and conditions. Moreover, all statements herein reciting principles, aspects, and aspects of embodiments of the present disclosure as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the embodiments of the present disclosure, therefore, is not intended to be limited to the exemplary aspects shown and described herein. Rather, the scope and spirit of embodiments of the present disclosure are embodied by the appended claims.

That which is claimed is:

1. A piezoelectric transducer comprising:
a first piezoelectric layer;
a second piezoelectric layer disposed on at least a portion of the first piezoelectric layer;
a middle electrode layer disposed between the first and second piezoelectric layers, wherein the middle electrode layer comprises an inner region and an outer region spaced apart from the inner region, wherein the outer region of the middle electrode layer surrounds the inner region of the middle electrode layer;
a first via configured to expose a portion of the inner region of the middle electrode layer;

a second via configured to expose a portion of the outer region of the middle electrode layer;

a bottom electrode layer disposed on a surface of the first piezoelectric layer opposite the middle electrode layer;

a support layer disposed on a surface of the bottom electrode layer opposite the first piezoelectric layer; and a substrate on which at least a portion of the piezoelectric transducer is disposed.

2. The piezoelectric transducer of claim 1, wherein the inner region and the outer region of the middle electrode layer are substantially coplanar.

3. The piezoelectric transducer of claim 2, wherein the inner region of the middle electrode layer is circular.

4. The piezoelectric transducer of claim 3, wherein the outer region of the middle electrode layer is annular.

5. The piezoelectric transducer of claim 1, further comprising a top electrode layer disposed on a surface of the second piezoelectric layer opposite the middle electrode layer.

6. The piezoelectric transducer of claim 1, wherein the first piezoelectric layer and the second piezoelectric layer have the same polarity.

7. The piezoelectric transducer of claim 1, wherein the substrate comprises an opening through the substrate and a portion of the piezoelectric transducer is exposed through the opening.

8. The piezoelectric transducer of claim 1, wherein the piezoelectric transducer has a diameter ranging from 10 µm to 5000 µm.

9. The piezoelectric transducer of claim 1, further comprising a via exposing a portion of the bottom electrode.

10. The piezoelectric transducer of claim 1, wherein the piezoelectric transducer is substantially planar.

11. The piezoelectric transducer of claim 1, wherein the piezoelectric transducer is curved.

12. A device comprising one or more piezoelectric transducers, each piezoelectric transducer comprising:
   a first piezoelectric layer;
   a second piezoelectric layer disposed on at least a portion of the first piezoelectric layer;
   a middle electrode layer disposed between the first and second piezoelectric layers, wherein the middle electrode layer comprises an inner region and an outer region spaced apart from the inner region, wherein the outer region of the middle electrode layer surrounds the inner region of the middle electrode layer;
   a first via configured to expose a portion of the inner region of the middle electrode layer;
   a second via configured to expose a portion of the outer region of the middle electrode layer;
   a bottom electrode layer disposed on a surface of the first piezoelectric layer opposite the middle electrode layer;
   a support layer disposed on a surface of the bottom electrode layer opposite the first piezoelectric layer; and
   a substrate on which at least a portion of the piezoelectric transducer is disposed.

13. The device of claim 12, wherein the device comprises an array of the piezoelectric transducers.

14. The device of claim 13, wherein the array comprises 10 or more of the piezoelectric transducers.

15. A method of directing sound waves to a target, the method comprising:
   producing sound waves from a piezoelectric transducer comprising:
   a first piezoelectric layer;
   a second piezoelectric layer disposed on at least a portion of the first piezoelectric layer;
   a middle electrode layer disposed between the first and second piezoelectric layers, wherein the middle electrode layer comprises an inner region and an outer region spaced apart from the inner region, wherein the outer region of the middle electrode layer surrounds the inner region of the middle electrode layer;
   a first via configured to expose a portion of the inner region of the middle electrode layer;
   a second via configured to expose a portion of the outer region of the middle electrode layer;
   a bottom electrode layer disposed on a surface of the first piezoelectric layer opposite the middle electrode layer;
   a support layer disposed on a surface of the bottom electrode layer opposite the first piezoelectric layer; and
   a substrate on which at least a portion of the piezoelectric transducer is disposed,
   wherein the piezoelectric transducer is configured to direct the produced sound waves to the target.

16. The method of claim 15, wherein the piezoelectric transducer further comprises a top electrode layer disposed on a surface of the second piezoelectric layer opposite the middle electrode layer.

17. The method of claim 15, wherein the producing comprises applying voltages having opposite phase to the inner region and the outer region of the middle electrode layer.

18. The method of claim 15, wherein the produced sound waves are ultrasound waves.

* * * * *